United States Patent
Huang

(10) Patent No.: US 11,069,605 B2
(45) Date of Patent: Jul. 20, 2021

(54) WIRING STRUCTURE HAVING LOW AND HIGH DENSITY STACKED STRUCTURES

(71) Applicant: Advanced Semiconductor Engineering, Inc., Kaohsiung (TW)

(72) Inventor: Wen Hung Huang, Kaohsiung (TW)

(*) Notice: Subject to any disclaimer, the term of this patent is extended or adjusted under 35 U.S.C. 154(b) by 0 days.

(21) Appl. No.: 16/399,909

(22) Filed: Apr. 30, 2019

(65) Prior Publication Data

US 2020/0350240 A1     Nov. 5, 2020

(51) Int. Cl.
| | |
|---|---|
| H01L 23/498 | (2006.01) |
| H01L 25/065 | (2006.01) |
| H01L 21/48 | (2006.01) |
| H01L 25/00 | (2006.01) |

(52) U.S. Cl.
CPC .... H01L 23/49833 (2013.01); H01L 21/4853 (2013.01); H01L 23/49811 (2013.01); H01L 25/0657 (2013.01); H01L 25/50 (2013.01); H01L 2225/0651 (2013.01); H01L 2225/06562 (2013.01)

(58) Field of Classification Search
CPC ......... H01L 23/49833; H01L 23/49811; H01L 25/0657; H01L 25/50
See application file for complete search history.

(56) References Cited

U.S. PATENT DOCUMENTS

| | | | |
|---|---|---|---|
| 7,304,370 B2 * | 12/2007 | Imaizumi | H01L 23/49531 257/666 |
| 7,321,164 B2 | 1/2008 | Hsu | |
| 7,342,803 B2 | 3/2008 | Inagaki et al. | |
| 7,425,762 B2 * | 9/2008 | Hasebe | H01L 23/142 257/707 |
| 7,514,770 B2 * | 4/2009 | Chang | H01L 23/5389 174/260 |
| 7,656,015 B2 | 2/2010 | Wong et al. | |
| 7,656,040 B2 * | 2/2010 | Hsu | H01L 23/5389 257/777 |
| 7,989,895 B2 * | 8/2011 | White | H01L 25/16 257/379 |
| 8,288,875 B2 | 10/2012 | Shimizu et al. | |
| 8,922,005 B2 * | 12/2014 | Hu | H01L 24/20 257/737 |

(Continued)

OTHER PUBLICATIONS

Non-Final Office Action for U.S. Appl. No. 16/399,907, dated May 5, 2020, 11 pages.

Primary Examiner — Ida M Soward
(74) Attorney, Agent, or Firm — Foley & Lardner LLP

(57) ABSTRACT

A wiring structure includes at least one upper conductive structure, a lower conductive structure and an intermediate layer. The upper conductive structure includes at least one upper dielectric layer, at least one upper circuit layer in contact with the upper dielectric layer, and at least one bonding portion electrically connected to the upper circuit layer. The lower conductive structure includes at least one lower dielectric layer and at least one lower circuit layer in contact with the lower dielectric layer. The intermediate layer is disposed between the upper conductive structure and the lower conductive structure and bonding the upper conductive structure and the lower conductive structure together. The upper conductive structure is electrically connected to the lower conductive structure.

20 Claims, 25 Drawing Sheets

(56) References Cited

U.S. PATENT DOCUMENTS

| | | | |
|---|---|---|---|
| 8,999,753 B2* | 4/2015 | Watanabe | H01L 21/486 |
| | | | 438/106 |
| 9,119,319 B2* | 8/2015 | Kaneda | H05K 3/0052 |
| 9,232,638 B2* | 1/2016 | Kato | H05K 3/4602 |
| 10,485,098 B2* | 11/2019 | Miki | H05K 1/186 |
| 10,510,698 B2 | 12/2019 | Yu et al. | |
| 10,566,298 B2* | 2/2020 | Dalmia | H01L 21/563 |
| 10,636,741 B2* | 4/2020 | Sawada | H01L 24/16 |
| 10,643,960 B2* | 5/2020 | Kariyazaki | H01L 23/49838 |
| 10,672,779 B2* | 6/2020 | Shimojo | H01L 27/11526 |
| 10,763,217 B2* | 9/2020 | Lee | H01L 23/66 |
| 2008/0158091 A1* | 7/2008 | Imaoka | H01Q 1/243 |
| | | | 343/851 |
| 2013/0099390 A1* | 4/2013 | Kurita | H01L 21/568 |
| | | | 257/774 |
| 2014/0185264 A1 | 7/2014 | Chen et al. | |
| 2014/0239508 A1* | 8/2014 | Ichikawa | H01L 24/05 |
| | | | 257/774 |
| 2015/0245473 A1* | 8/2015 | Shimizu | H05K 1/036 |
| | | | 257/778 |
| 2015/0279776 A1 | 10/2015 | Hu et al. | |
| 2016/0013076 A1 | 1/2016 | Vincent et al. | |
| 2016/0020163 A1* | 1/2016 | Shimizu | H01L 23/49822 |
| | | | 361/768 |
| 2016/0066417 A1 | 3/2016 | Sugiyama et al. | |
| 2016/0081194 A1 | 3/2016 | Sato et al. | |
| 2016/0338202 A1 | 11/2016 | Park et al. | |
| 2018/0130781 A1* | 5/2018 | Kang | H01L 25/0652 |
| 2018/0350786 A1* | 12/2018 | Hung | H01L 21/4857 |
| 2019/0259742 A1* | 8/2019 | Han | H01L 25/0652 |
| 2019/0380212 A1* | 12/2019 | Chien | H05K 3/4038 |
| 2020/0020638 A1* | 1/2020 | Heo | H01L 24/09 |
| 2020/0020653 A1 | 1/2020 | Lim et al. | |
| 2020/0051918 A1 | 2/2020 | Bae et al. | |
| 2020/0066631 A1* | 2/2020 | Wang | H01L 21/76876 |
| 2020/0075488 A1* | 3/2020 | Wu | H01L 21/56 |
| 2020/0091102 A1* | 3/2020 | Aoki | H05K 3/4038 |
| 2020/0211945 A1* | 7/2020 | Huang | H01L 21/486 |
| 2020/0266178 A1* | 8/2020 | Lee | H01L 23/5384 |
| 2020/0279804 A1* | 9/2020 | Huang | H01L 23/5283 |
| 2020/0279814 A1* | 9/2020 | Huang | H01L 23/49827 |
| 2020/0279815 A1* | 9/2020 | Huang | H01L 23/562 |

* cited by examiner

WIRING STRUCTURE HAVING LOW AND HIGH DENSITY STACKED STRUCTURES

BACKGROUND

1. Field of the Disclosure

The present disclosure relates to a wiring structure and a manufacturing method, and to a wiring structure including at least two conductive structures attached or bonded together by an intermediate layer, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes: (a) at least one upper conductive structure including at least one upper dielectric layer, at least one upper circuit layer in contact with the upper dielectric layer, and at least one bonding portion electrically connected to the upper circuit layer; (b) a lower conductive structure including at least one lower dielectric layer and at least one lower circuit layer in contact with the lower dielectric layer; and (c) an intermediate layer disposed between the at least one upper conductive structure and the lower conductive structure and bonding the at least one upper conductive structure and the lower conductive structure together, wherein the at least one upper conductive structure is electrically connected to the lower conductive structure.

In some embodiments, a wiring structure includes: (a) a low-density stacked structure including at least one dielectric layer, at least one low-density circuit layer in contact with the dielectric layer, and at least one bonding portion electrically connected to the low-density circuit layer; (b) at least one high-density stacked structure disposed on the low-density stacked structure, wherein the high-density stacked structure includes at least one dielectric layer, at least one high-density circuit layer in contact with the dielectric layer of the high-density stacked structure, and at least one bonding portion electrically connected to the high-density circuit layer; (c) an intermediate layer disposed between the low-density stacked structure and the high-density stacked structure and bonding the low-density stacked structure and the high-density stacked structure together; and (d) a plurality of bonding wires connecting the at least one bonding portion of the at least one high-density stacked structure and the at least one bonding portion of the low-density stacked structure.

In some embodiments, a wiring structure includes: (a) a low-density stacked structure including at least one dielectric layer and at least one low-density circuit layer in contact with the dielectric layer; (b) at least one high-density stacked structure disposed on the low-density stacked structure, wherein the high-density stacked structure includes at least one dielectric layer, at least one high-density circuit layer in contact with the dielectric layer of the high-density stacked structure, and at least one bonding portion electrically connected to the high-density circuit layer; (c) an intermediate layer disposed between the low-density stacked structure and the high-density stacked structure and bonding the low-density stacked structure and the high-density stacked structure together; and (d) a plurality of through vias extending through at least a portion of the at least one high-density stacked structure, the intermediate layer and at least a portion of the low-density stacked structure, and electrically connecting the at least one high-density stacked structure and the low-density stacked structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
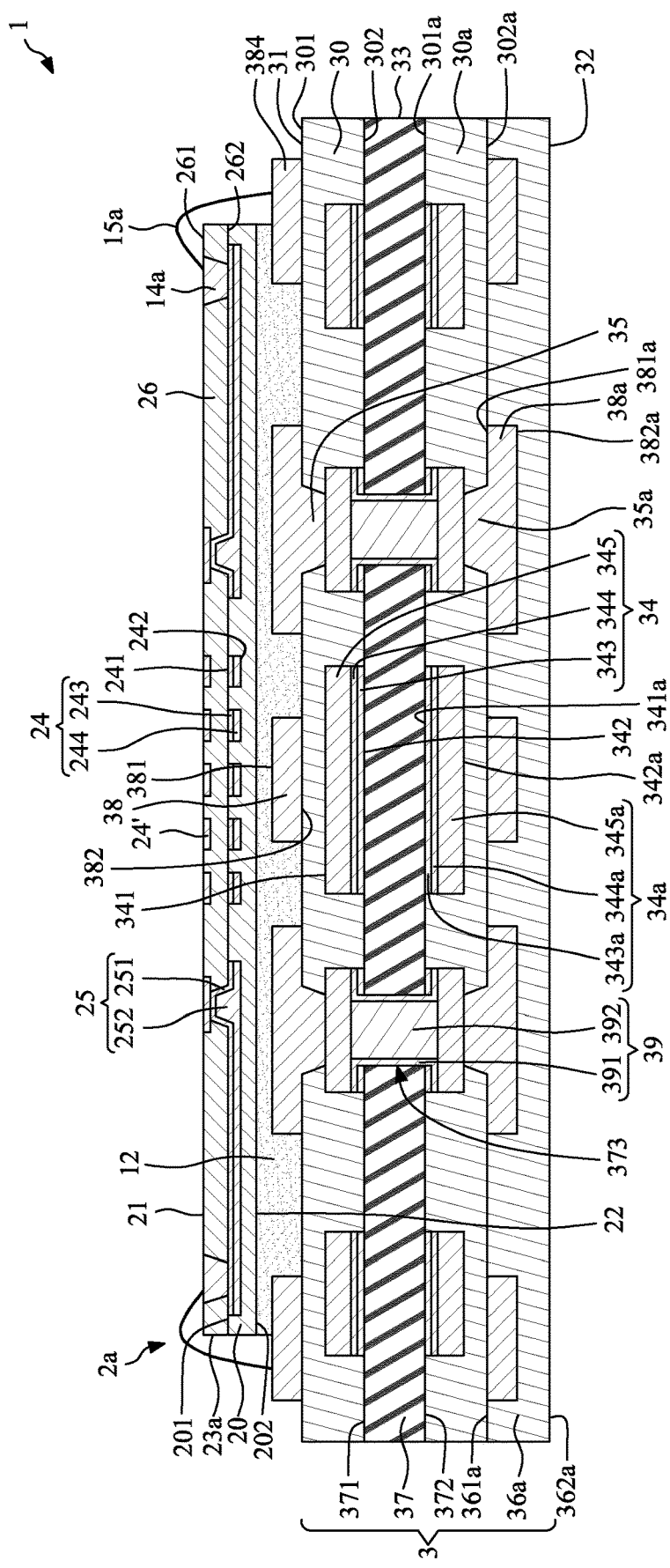
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}=28.24\%$. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 µm/2 µm, the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the wiring structure.

FIG. 1 illustrates a cross-sectional view of a wiring structure 1 according to some embodiments of the present disclosure. The wiring structure 1 includes at least one upper conductive structure (including, for example, a first upper conductive structure 2a), a lower conductive structure 3, an intermediate layer 12 and a plurality of first bonding wires 15a.

The first upper conductive structure 2 includes at least one dielectric layer (including, for example, a first dielectric layer 20 and a second dielectric layer 26), at least one circuit layer (including, for example, a first circuit layer 24 and a second circuit layer 24' formed of a metal, a metal alloy, or other conductive material) and at least one bonding portion 14a. The circuit layer (including, for example, the first circuit layer 24 and the second circuit layer 24') are in contact with the dielectric layer (e.g., the first dielectric layer 20 and the second dielectric layer 26). The bonding portion 14a is electrically connected to the circuit layer (including, for example, the first circuit layer 24 and the second circuit layer 24'). In some embodiments, the bonding portion 14a extends through the second dielectric layer 26 and contacts the first circuit layer 24. That is, the second dielectric layer 26 defines a through hole for accommodating the bonding portion 14a. Further, the bonding portion 14a tapers downwardly; that is, a size of a top portion of the bonding portion 14a is greater than a size of a bottom portion of the bonding portion 14a. In some embodiments, the bonding portion 14a is a monolithic structure or a one-piece structure having a homogeneous material composition. The bonding portion 14a may be a bonding pad such as a finger pad that is used for wire bonding.

In some embodiments, the first upper conductive structure 2a may be similar to a coreless substrate, and may be in a wafer type, a panel type or a strip type. The first upper conductive structure 2a may be also referred to as "a stacked structure" or "a high-density conductive structure" or "a high-density stacked structure". The circuit layer (including, for example, the first circuit layer 24 and the second circuit layer 24') of the first upper conductive structure 2a may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The first upper conductive structure 2a has a top surface 21, a bottom surface 22 opposite to the top surface 21 and a lateral surface 23a extending between the top surface 21 and the bottom surface 22. The first upper conductive structure 2a includes a plurality of dielectric layers (e.g., the first dielectric layer 20 and the second dielectric layer 26), a plurality of circuit layers (e.g., the first circuit layer 24 and the second circuit layer 24'), a plurality of bonding portions 14a and at least one inner via 25. The dielectric layers (e.g., the first dielectric layer 20 and the second dielectric layer 26) are stacked on one another. For example, the second dielectric layer 26 is disposed on the first dielectric layer 20, and, thus, the second dielectric layer 26 is the topmost dielectric layer. In some embodiments, a material of the dielectric layers (e.g., the first dielectric layer 20 and the second dielectric layer 26) is transparent, and can be seen through by human eyes or machine. That is, a mark disposed adjacent to the bottom surface 22 of the first upper conductive structure 2a can be recognized or detected from the top surface 21 of the first upper conductive structure 2a by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, the first dielectric layer 20 has a top surface 201 and a bottom surface 202 opposite to the top surface 201. The second dielectric layer 26 has a top surface 261 and a bottom surface 262 opposite to the top surface 261. The bottom surface 262 of the second dielectric layer 26 is disposed on and contacts the top surface 201 of the adjacent first dielectric layer 20. Thus, the top surface 21 of the upper conductive structure 2a is the top surface 261 of the second dielectric layer 26, and the bottom surface 22 of the upper conductive structure 2a is the bottom surface 202 of the bottommost first dielectric layer 20.

The first circuit layer 24 may be a fan-out circuit layer or a redistribution layer (RDL), and an L/S of the first circuit layer 24 may be less than or equal to about 2 µm/about 2 µm, or less than or equal to about 1.8 µm/about 1.8 µm. The first circuit layer 24 has a top surface 241 and a bottom surface 242 opposite to the top surface 241. In some embodiments, the first circuit layer 24 is embedded in the first dielectric layer 20, and the top surface 241 of the first circuit layer 24 may be substantially coplanar with the top surface 201 of the first dielectric layer 20. In some embodiments, the first circuit layer 24 may include a seed layer 243 and a conductive material 244 (e.g., a metallic material) disposed on the seed layer 243. In addition, the second circuit layer 24' is embedded in the second dielectric layer 26, and a top surface of the second circuit layer 24' may be substantially coplanar with the top surface 261 of the second dielectric layer 26. An L/S of the second circuit layer 24' may be greater than or equal to the L/S of the first circuit layer 24.

The first upper conductive structure 2a includes a plurality of inner vias 25. The inner vias 25 are disposed between the first circuit layer 24 and the second circuit layer 24' for electrically connecting the first circuit layer 24 and the second circuit layer 24'. In some embodiments, the inner via 25 may include a seed layer 251 and a conductive material 252 (e.g., a metallic material) disposed on the seed layer 251. In some embodiments, the inner via 25 and the first circuit layer 24 may be formed integrally as a monolithic or one-piece structure. The inner via 25 tapers upwardly along a direction from the bottom surface 22 towards the top surface 21 of the upper conductive structure 2a. That is, a size (e.g., a width) of a top portion of the inner via 25 is less than a size (e.g., a width) of a bottom portion of the inner via 25 that is closer towards the bottom surface 22. Thus, a tapering direction of the inner via 25 is different from a tapering direction of the bonding portion 14a. In some embodiments, a maximum width of the inner via 25 (e.g., at the bottom portion) may be less than or equal to about 25 µm, such as about 25 µm, about 20 µm, about 15 µm or about 10 µm.

The lower conductive structure 3 includes at least one dielectric layer (including, for example, one first upper dielectric layer 30, one first lower dielectric layer 30a and one second lower dielectric layer 36a) and at least one circuit layer (including, for example, one first upper circuit layer 34, one second upper circuit layer 38, one first lower circuit layer 34a and one second lower circuit layer 38a formed of a metal, a metal alloy, or other conductive material) in contact with the dielectric layer (e.g., the first upper dielectric layer 30, the first lower dielectric layer 30a and the second lower dielectric layer 36a). In some embodiments, the lower conductive structure 3 may be similar to a core substrate that further includes a core portion 37, and may be in a wafer type, a panel type or a strip type. The lower conductive structure 3 may be also referred to as "a stacked structure" or "a low-density conductive structure" or "a low-density stacked structure". The circuit layer (including, for example, the first upper circuit layer 34, the second upper circuit layer 38, the first lower circuit layer 34a and the second lower circuit layer 38a) of the lower conductive structure 3 may be also referred to as "a low-density circuit layer". As shown in FIG. 1, the lower conductive structure 3 has a top surface 31, a bottom surface 32 opposite to the top surface 31 and a lateral surface 33 extending between the top surface 31 and the bottom surface 32. The lower conductive structure 3 includes a plurality of dielectric layers (for example, the first upper dielectric layer 30, the first lower dielectric layer 30a and the second lower dielectric layer 36a), a plurality of circuit layers (for example, the first upper circuit layer 34, the second upper circuit layer 38, the first lower circuit layer 34a and the second lower circuit layer 38a) and at least one inner via (including, for example, a plurality of upper interconnection vias 35 and a plurality of lower interconnection vias 35a).

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. The first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a contacts the bottom surface 372 of the core portion 37. The second lower dielectric layer 36a is stacked or disposed on the first lower dielectric layer 30a, and has a top surface 361a and a bottom surface 362a opposite to the top surface 361a. Thus, the top surface 361a of the second lower dielectric layer 36a contacts the bottom surface 302a of the first lower dielectric layer 30a, and the second lower dielectric layer 36a is the bottommost dielectric layer. As shown in FIG. 1, the top surface 31 of the lower conductive structure 3 is the top surface 301 of the first upper dielectric layer 30, and the bottom surface 32 of the lower conductive structure 3 is the bottom surface 362a of the second lower dielectric layer 36a.

A thickness of each of the dielectric layers (e.g., the first dielectric layer 20 and the second dielectric layer 26) of the first upper conductive structure 2a is less than or equal to about 40%, less than or equal to about 35%, less than or equal to about 30% of a thickness of each of the dielectric layers (e.g., the first upper dielectric layer 30, the first lower dielectric layer 30a and the second lower dielectric layer 36a) of the lower conductive structure 3. For example, a thickness of each of the dielectric layers (e.g., the first dielectric layer 20 and the second dielectric layer 26) of the first upper conductive structure 2a may be less than or equal to about 7 µm, and a thickness of each of the dielectric layers (e.g., the first upper dielectric layer 30, the first lower dielectric layer 30a and the second lower dielectric layer 36a) of the lower conductive structure 3 may be about 40 µm.

An L/S of the first upper circuit layer 34 may be greater than or equal to about 10 µm/about 10 µm. Thus, the L/S of the first upper circuit layer 34 may be greater than or equal to about five times the L/S of the first circuit layer 24 of the first upper conductive structure 2a. The first upper circuit layer 34 has a top surface 341 and a bottom surface 342 opposite to the top surface 341. In some embodiments, the first upper circuit layer 34 is formed or disposed on the top surface 371 of the core portion 37, and covered by the first upper dielectric layer 30. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 µm/about 10 µm. Thus, the L/S of the second upper circuit layer 38 may be substantially equal to the L/S of the first upper circuit layer 34, and may be greater than or equal to about five times the L/S of the first circuit layer 24 of the first upper conductive structure 2a. The second upper circuit layer 38 has a top surface 381 and a bottom surface 382 opposite to the top surface 381. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

An L/S of the first lower circuit layer 34a may be greater than or equal to about 10 μm/about 10 μm. Thus, the L/S of the first lower circuit layer 34a may be greater than or equal to about five times the L/S of the first circuit layer 24 of the first upper conductive structure 2a. The first lower circuit layer 34a has a top surface 341a and a bottom surface 342a opposite to the top surface 341a. In some embodiments, the first lower circuit layer 34a is formed or disposed on the bottom surface 372 of the core portion 37, and covered by the first lower dielectric layer 30a. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the first circuit layer 24 of the first upper conductive structure 2a. The second lower circuit layer 38a has a top surface 381a and a bottom surface 382a opposite to the top surface 381a. In some embodiments, the second lower circuit layer 38a is formed or disposed on the bottom surface 302a of the first lower dielectric layer 30a, and covered by the second lower dielectric layer 36a. The top surface 381a of the second lower circuit layer 38a contacts the bottom surface 302a of the first lower dielectric layer 30a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection vias 35a tapers upwardly along a direction from the bottom surface 32 towards the top surface 31 of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

In some embodiments, from a top view, a size of the first upper conductive structure 2a is smaller than a size of the lower conductive structure 3. A gap between the lateral surface 23a of the first upper conductive structure 2a and the lateral surface 33 of the lower conductive structure 3 may be about 100 μm; thus, the first upper conductive structure 2a does not fully cover (or at least partially exposes) a bonding portion (e.g., a pad portion 384) of the lower conductive structure 3.

The intermediate layer 12 is interposed or disposed between the first upper conductive structure 2a and the lower conductive structure 3 to bond the first upper conductive structure 2a and the lower conductive structure 3 together. That is, the intermediate layer 12 adheres to the bottom surface 22 of the first upper conductive structure 2a and the top surface 31 of the lower conductive structure 3. In some embodiments, the intermediate layer 12 may be an adhesion layer that is cured from an adhesive material (e.g., includes a cured adhesive material such as an adhesive polymeric material). The intermediate layer 12 has a top surface and a bottom surface opposite to the top surface. The top surface of the intermediate layer 12 contacts the bottom surface 22 of the first upper conductive structure 2a (that is, the bottom surface 22 of the first upper conductive structure 2a is attached to the top surface of the intermediate layer), and the bottom surface of the intermediate layer 12 contacts the top surface 31 of the lower conductive structure 3. In some embodiments, a bonding force between two adjacent dielectric layers (e.g., the first dielectric layer 20 and the second dielectric layer 26) of the first upper conductive structure 2a is greater than a bonding force between a dielectric layer (e.g., the first dielectric layer 20) of the first upper conductive structure 2a and the intermediate layer 12. A surface roughness of a boundary between two adjacent dielectric layers (e.g., the first dielectric layer 20 and the second dielectric layer 26) of the first upper conductive structure 2a is greater than a surface roughness of a boundary between a dielectric layer (e.g., the first dielectric layer 20) of the first upper conductive structure 2a and the intermediate layer 12, such as about 1.1 times or greater, about 1.3 times or greater, or about 1.5 times or greater in terms of root mean squared surface roughness.

The first bonding wires 15a connect respective ones of the bonding portions 14a of the first upper conductive structure 2a and the bonding portions (e.g., the pad portions 384) of the second upper circuit layer 38 of the lower conductive structure 3. Thus, the first upper conductive structure 2a is electrically connected to the lower conductive structure 3 through the first bonding wires 15a.

As shown in the embodiment illustrated in FIG. 1, the wiring structure 1 is a combination of the first upper conductive structure 2a and the lower conductive structure 3, in which the first circuit layer 24 and the second circuit layer 26 of the first upper conductive structure 2a has fine pitch, high yield and low thickness; and the circuit layers (e.g., the first upper circuit layer 34, the second upper circuit layer 38, the first lower circuit layer 34a and the second lower circuit layer 38a) of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes two circuit layers (e.g., the first circuit layer 24 and the second circuit layer 26) of the first upper conductive structure 2a and four layers of the circuit layers (e.g., the first upper circuit layer 34, the second upper circuit layer 38, the first lower circuit layer 34a and the second lower circuit layer 38a) of the lower conductive structure 3. The manufacturing yield for one layer of the first circuit layer 24 and the second circuit layer 26 of the first upper conductive structure 2a may be 99%, and the manufacturing yield for one layer of the circuit layers (e.g., the first upper circuit layer 34, the second upper circuit layer 38, the first lower circuit layer 34a and the second lower circuit layer 38a) of the lower conductive structure 3 may be 90%. Thus, the yield of the wiring structure 1 may be improved. In addition, the warpage of the first upper conductive structure 2a and the warpage of the lower conductive structure 3 are separated and will not influence each other. In some embodiments, a warpage shape of the first upper conductive structure 2a may be different from a warpage shape of the lower conductive structure 3. For example, the warpage shape of the first upper conductive structure 2a may be a convex shape, and the warpage shape of the lower conductive structure 3 may be a concave shape. In some embodiments, the warpage shape of the first upper conductive structure 2a may be the same as the warpage shape of the lower conductive structure 3; however, the warpage of the lower conductive structure 3 will not be accumulated onto the warpage of the first upper conductive structure 2a. Thus, the yield of the wiring structure 1 may be further improved.

In addition, during a manufacturing process, the lower conductive structure 3 and the first upper conductive structure 2a may be tested individually before being bonded together. Therefore, known good lower conductive structure 3 and known good first upper conductive structure 2a may be selectively bonded together. Bad (or unqualified) lower conductive structure 3 and bad (or unqualified) first upper conductive structure 2a may be discarded. As a result, the yield of the wiring structure 1 may be further improved.

Figure 2:
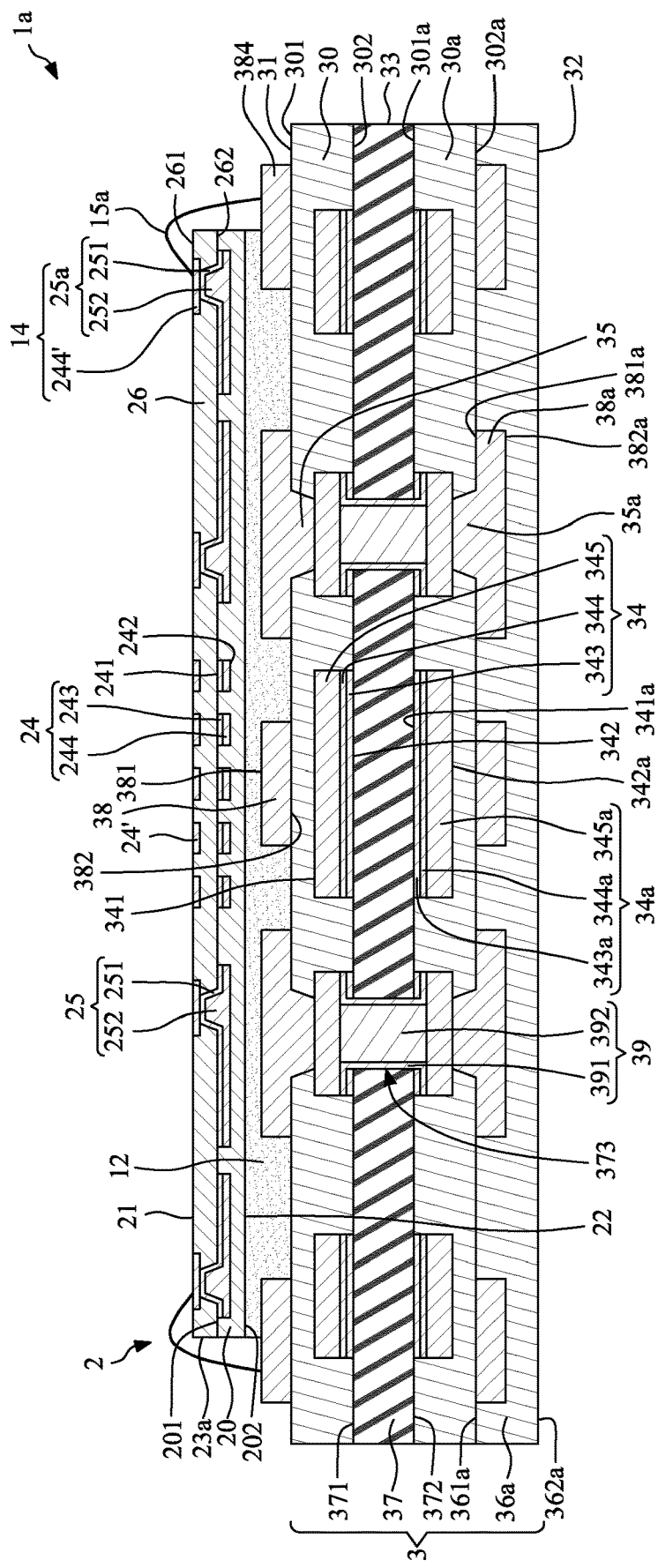
FIG. 2 illustrates a cross-sectional view of a wiring structure according to some embodiments of the present disclosure.

FIG. 2 illustrates a cross-sectional view of a wiring structure 1a according to some embodiments of the present disclosure. The wiring structure 1a is similar to the wiring structure 1 shown in FIG. 1, except for a structure of a bonding portion 14 of a first upper conductive structure 2. As shown in FIG. 2, the bonding portion 14 includes a pad portion 244' and a via portion 25a. The pad portion 244' may be a part of the second circuit layer 24' of the first upper conductive structure 2. The via portion 25a is disposed between the first circuit layer 24 and the second circuit layer 24' for electrically connecting the first circuit layer 24 and the second circuit layer 24'. A top portion of the via portion 25a contacts and/or electrically connects to the pad portion 244' of the second circuit layer 24'. In some embodiments, the via portion 25a may include a seed layer 251 and a conductive material 252 (e.g., a metallic material) disposed on the seed layer 251. In some embodiments, the via portion 25a and the first circuit layer 24 may be formed integrally as a monolithic or one-piece structure. The via portion 25a tapers upwardly along a direction from the bottom surface 22 towards the top surface 21 of the upper conductive structure 2. That is, a size (e.g., a width) of a top portion of the via portion 25a is less than a size (e.g., a width) of a bottom portion of the via portion 25a that is closer towards the bottom surface 22. Thus, a tapering direction of the inner via 25 is the same as a tapering direction of the via portion 25a of the bonding portion 14. In some embodiments, a size of the via portion 25a may be greater than a size of the inner via 25. As shown in FIG. 2, an end of the first bonding wires 15a contacts and/or electrically connects to the pad portion 244' of the second circuit layer 24' of the first upper conductive structure 2. In some embodiments, the pad portion 244' of the second circuit layer 24' of the first upper conductive structure 2 may be omitted, and the top portion of the via portion 25a may be exposed from the top surface 261 of the second dielectric layer 26. Thus, the via portion 25a is the bonding portion 14, an end of the first bonding wires 15a may contact and/or electrically connect to the top portion of the via portion 25a directly.

Figure 3:
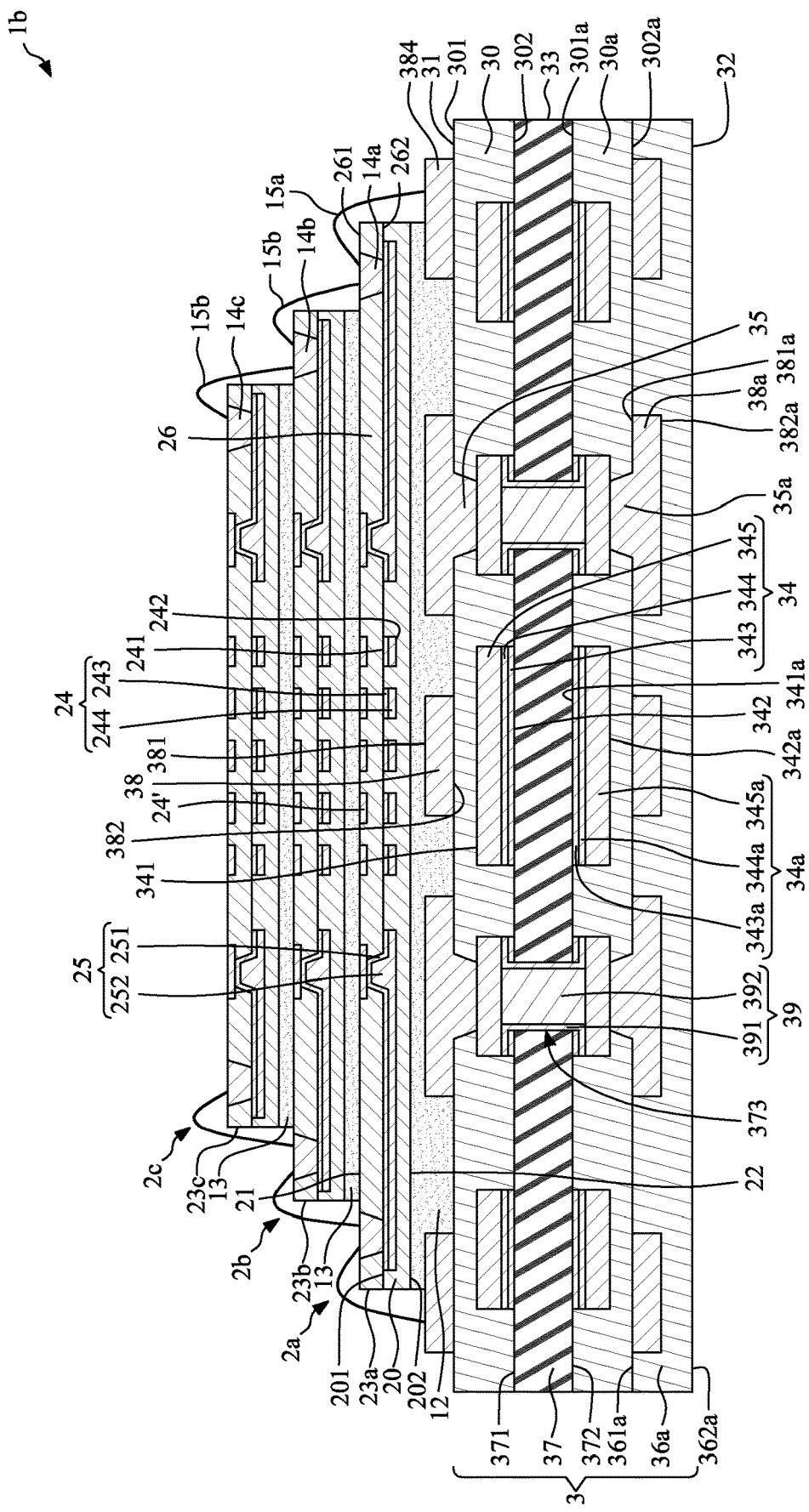
FIG. 3 illustrates a cross-sectional view of a wiring structure according to some embodiments of the present disclosure.

FIG. 3 illustrates a cross-sectional view of a wiring structure 1b according to some embodiments of the present disclosure. The wiring structure 1b is similar to the wiring structure 1 shown in FIG. 1, except that at least one upper conductive structure includes a plurality of upper conductive structures (e.g., the first upper conductive structure 2a, a second upper conductive structure 2b and a third upper conductive structure 2c) stacked on one another. The structures of the second upper conductive structure 2b and the third upper conductive structure 2c may be substantially same as the structure of the first upper conductive structure 2a. The second upper conductive structure 2b has a lateral surface 23b, and includes a bonding portion 14b. The third upper conductive structure 2c has a lateral surface 23c, and includes a bonding portion 14c. As shown in FIG. 3, sizes of the upper conductive structures (e.g., the first upper conductive structure 2a, the second upper conductive structure 2b and the third upper conductive structure 2c) are different from each other. For example, from a top view, the size of the second upper conductive structure 2b is smaller than the size of the first upper conductive structure 2a, and the size of the third upper conductive structure 2c is smaller than the size of the second upper conductive structure 2b. A gap between the lateral surface 23b of the second upper conductive structure 2b and the lateral surface 23a of the first upper conductive structure 2a may be about 80 µm; thus, the second upper conductive structure 2b does not fully cover (or at least partially exposes) the bonding portion 14a of the first upper conductive structure 2a. Further, a gap between the lateral surface 23c of the third upper conductive structure 2c and the lateral surface 23b of the second upper conductive structure 2b may be about 80 µm; thus, the third upper conductive structure 2c does not fully cover (or at least partially exposes) the bonding portion 14b of the second upper conductive structure 2b.

In addition, the wiring structure 1b further includes at least one intervening layer 13 (e.g., adhesion layer) and a plurality of second bonding wires 15b. One intervening layer 13 is disposed between the first upper conductive structure 2a and the adjacent second upper conductive structure 2b and bonds the two adjacent upper conductive structures (e.g., the first upper conductive structure 2a and the second upper conductive structure 2b) together. Another intervening layer 13 is disposed between the second upper conductive structure 2b and the adjacent third upper conductive structure 2c and bonds the two adjacent upper conductive structures (e.g., the second upper conductive structure 2b and the third upper conductive structure 2c)

together. The second bonding wires 15b are included for connecting the bonding portions of two adjacent upper conductive structures. For example, some of the second bonding wires 15b connect the bonding portion 14b of the second upper conductive structure 2b and the bonding portion 14a of the first upper conductive structure 2a. Some of the second bonding wires 15b connect the bonding portion 14c of the third upper conductive structure 2c and the bonding portion 14b of the second upper conductive structure 2b.

In some embodiments, there may be no inner via between the upper conductive structures (e.g., the first upper conductive structure 2a, the second upper conductive structure 2b and the third upper conductive structure 2c) to electrically connect the upper conductive structures (e.g., the first upper conductive structure 2a, the second upper conductive structure 2b and the third upper conductive structure 2c) internally. That is, there may be no internally electrical connection path between the upper conductive structures (e.g., the first upper conductive structure 2a, the second upper conductive structure 2b and the third upper conductive structure 2c). Thus, the upper conductive structures (e.g., the first upper conductive structure 2a, the second upper conductive structure 2b and the third upper conductive structure 2c) may be electrically connected to each other solely through the second bonding wires 15b.

Figure 4:
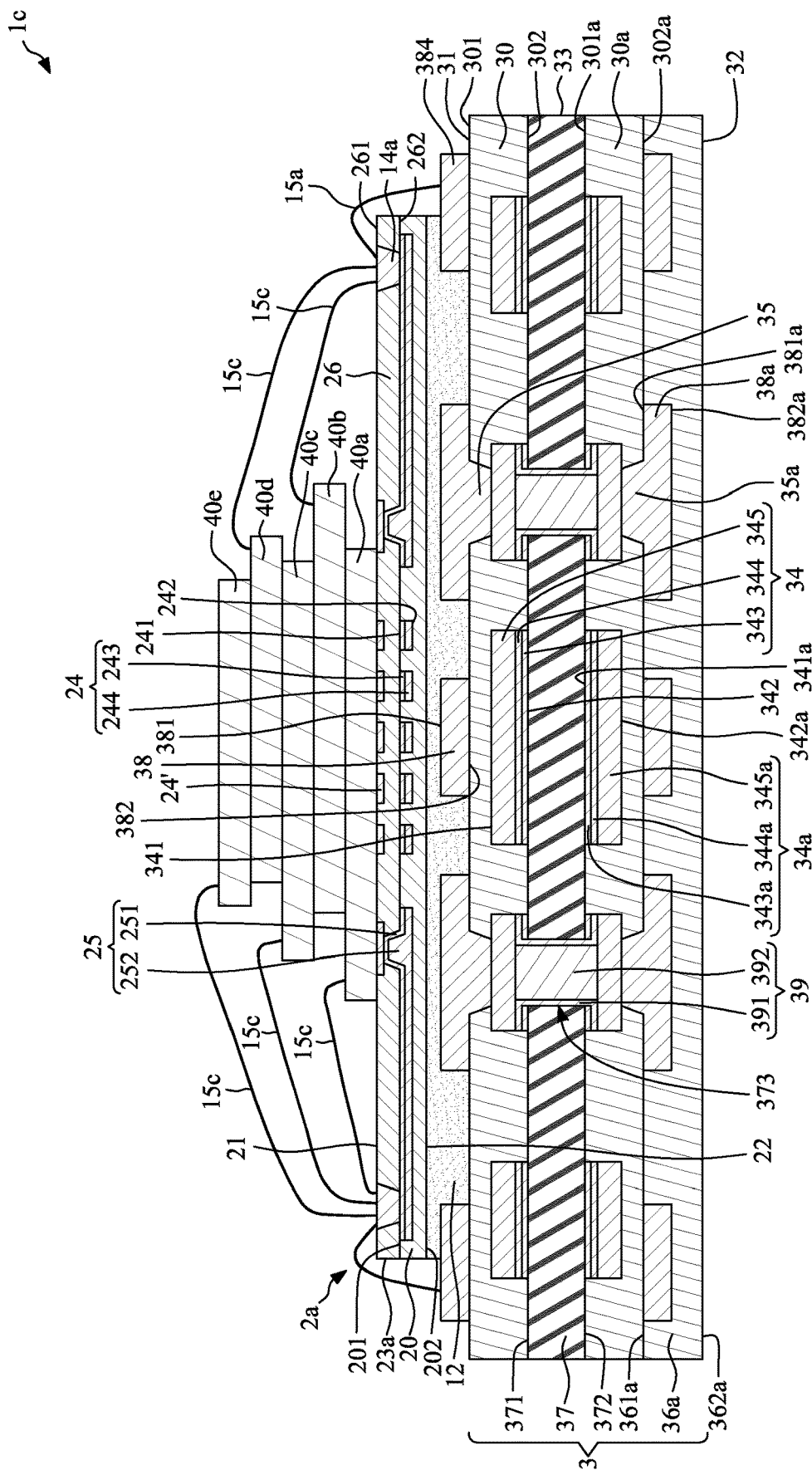
FIG. 4 illustrates a cross-sectional view of a wiring structure according to some embodiments of the present disclosure.
Figure 5:
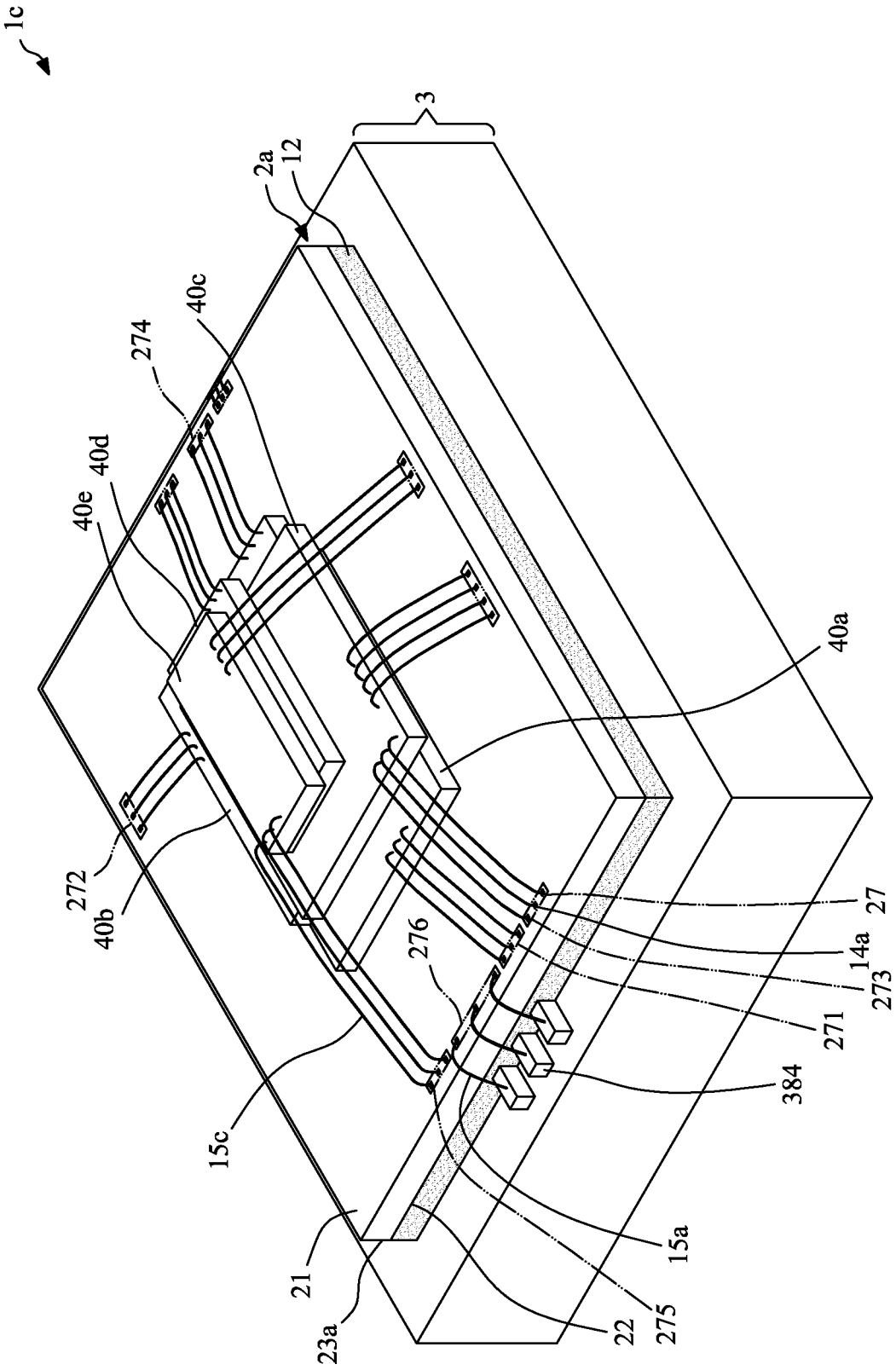
FIG. 5 illustrates a perspective view of the wiring structure of FIG. 4.

FIG. 4 illustrates a cross-sectional view of a wiring structure 1c according to some embodiments of the present disclosure. FIG. 5 illustrates a perspective view of the wiring structure 1c of FIG. 4. The wiring structure 1c is similar to the wiring structure 1 shown in FIG. 1, except that a plurality of electronic devices (e.g., a first memory die 40a, a second memory die 40b, a third memory die 40c, a fourth memory die 40d and a fifth memory die 40e) and a plurality of third bonding wires 15c are included. The electronic devices (e.g., the first memory die 40a, the second memory die 40b, the third memory die 40c, the fourth memory die 40d and the fifth memory die 40e) are stacked on one another, and are stacked on the first upper conductive structure 2a. The positions of the electronic devices (e.g., the first memory die 40a, the second memory die 40b, the third memory die 40c, the fourth memory die 40d and the fifth memory die 40e) may be shifted or laterally displaced from each other so as to facilitate a wire bonding process. For example, the second memory die 40b is shifted from the first memory die 40a to expose the bonding portions of the first memory die 40a. As shown in FIG. 4 and FIG. 5, sizes of the electronic devices (e.g., the first memory die 40a, the second memory die 40b, the third memory die 40c, the fourth memory die 40d and the fifth memory die 40e) may be same as or different from each other.

The third bonding wires 15c are included for connecting the bonding portions of the electronic devices (e.g., the first memory die 40a, the second memory die 40b, the third memory die 40c, the fourth memory die 40d and the fifth memory die 40e) and the bonding portion 14a of the first upper conductive structure 2a. As shown in FIG. 5, the first upper conductive structure 2a may include a plurality of bonding areas 27 (e.g., a first bonding area 271, a second bonding area 272, a third bonding area 273, a fourth bonding area 274, a fifth bonding area 275 and a sixth bonding area 276). Each of the bonding areas 27 (e.g., the first bonding area 271, the second bonding area 272, the third bonding area 273, the fourth bonding area 274, the fifth bonding area 275 and the sixth bonding area 276) includes a plurality of bonding portions 14a. In some embodiments, the first memory die 40a is electrically connected to the bonding portions 14a in the first bonding area 271 through the third bonding wires 15c. The second memory die 40b is electrically connected to the bonding portions 14a in the second bonding area 272 through the third bonding wires 15c. The third memory die 40c is electrically connected to the bonding portions 14a in the third bonding area 273 through the third bonding wires 15c. The fourth memory die 40d is electrically connected to the bonding portions 14a in the fourth bonding area 274 through the third bonding wires 15c. The fifth memory die 40e is electrically connected to the bonding portions 14a in the fifth bonding area 275 through the third bonding wires 15c. In addition, the bonding portions 14a in the sixth bonding area 276 are electrically connected to the pad portions 384 of the lower conductive structure 3 through the first bonding wires 15a.

Figure 6:
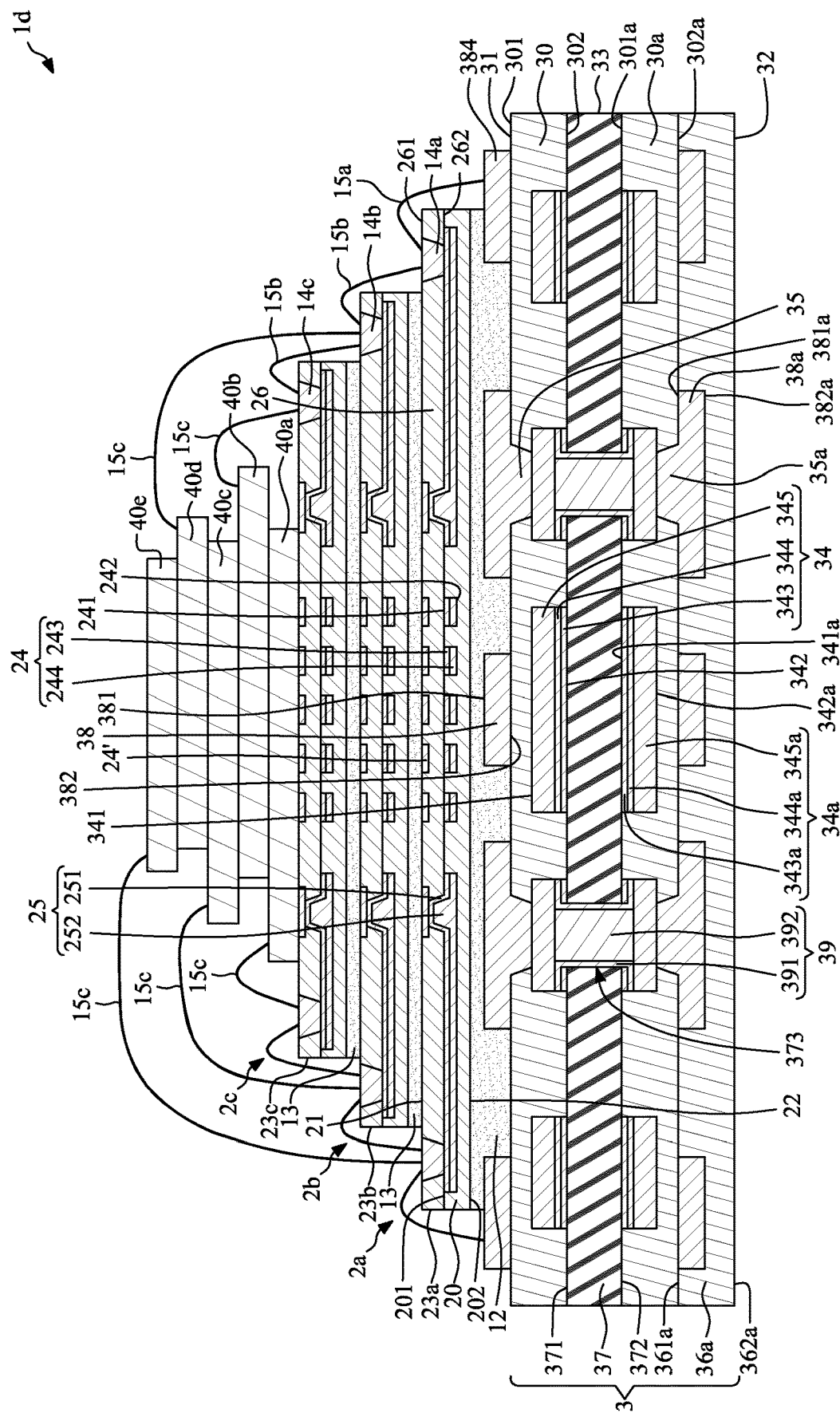
FIG. 6 illustrates a cross-sectional view of a wiring structure according to some embodiments of the present disclosure.
Figure 7:
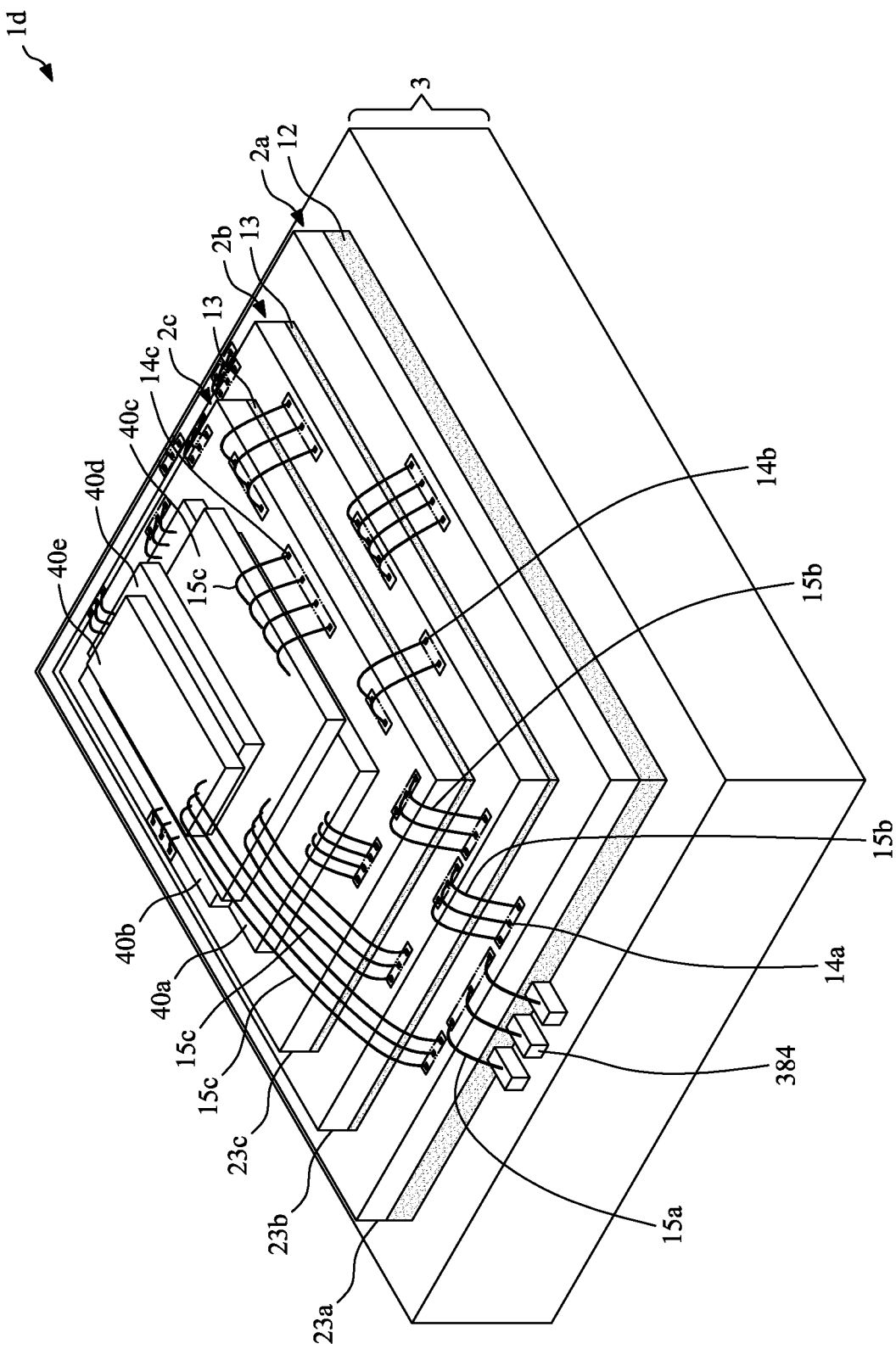
FIG. 7 illustrates a perspective view of the wiring structure of FIG. 6.

FIG. 6 illustrates a cross-sectional view of a wiring structure 1d according to some embodiments of the present disclosure. FIG. 7 illustrates a perspective view of the wiring structure 1d of FIG. 6. The wiring structure 1d is similar to the wiring structure 1b shown in FIG. 3, except that a plurality of electronic devices (e.g., a first memory die 40a, a second memory die 40b, a third memory die 40c, a fourth memory die 40d and a fifth memory die 40e) and a plurality of third bonding wires 15c are included. The electronic devices (e.g., the first memory die 40a, the second memory die 40b, the third memory die 40c, the fourth memory die 40d and the fifth memory die 40e) are stacked on one another, and are stacked on the third upper conductive structure 2c. The positions of the electronic devices (e.g., the first memory die 40a, the second memory die 40b, the third memory die 40c, the fourth memory die 40d and the fifth memory die 40e) may be shifted or laterally displaced from each other so as to facilitate a wire bonding process. For example, the second memory die 40b is shifted from the first memory die 40a to expose the bonding portions of the first memory die 40a. As shown in FIG. 6 and FIG. 7, sizes of the electronic devices (e.g., the first memory die 40a, the second memory die 40b, the third memory die 40c, the fourth memory die 40d and the fifth memory die 40e) may be same as or different from each other.

The third bonding wires 15c are included for connecting the bonding portions of the electronic devices (e.g., the first memory die 40a, the second memory die 40b, the third memory die 40c, the fourth memory die 40d and the fifth memory die 40e) and the bonding portions (e.g., the bonding portions 14a, 14b, 14c) of the upper conductive structures (e.g., the first upper conductive structure 2a, the second upper conductive structure 2b and the third upper conductive structure 2c). In some embodiments, the first memory die 40a and the second memory die 40b may be electrically connected to the bonding portions 14c of the third upper conductive structure 2c through the third bonding wires 15c. The third memory die 40c and the fourth memory die 40d may be electrically connected to the bonding portions 14b of the second upper conductive structure 2b through the third bonding wires 15c. The fifth memory die 40e may be electrically connected to the bonding portions 14a of the first upper conductive structure 2a through the third bonding wires 15c.

Figure 8:
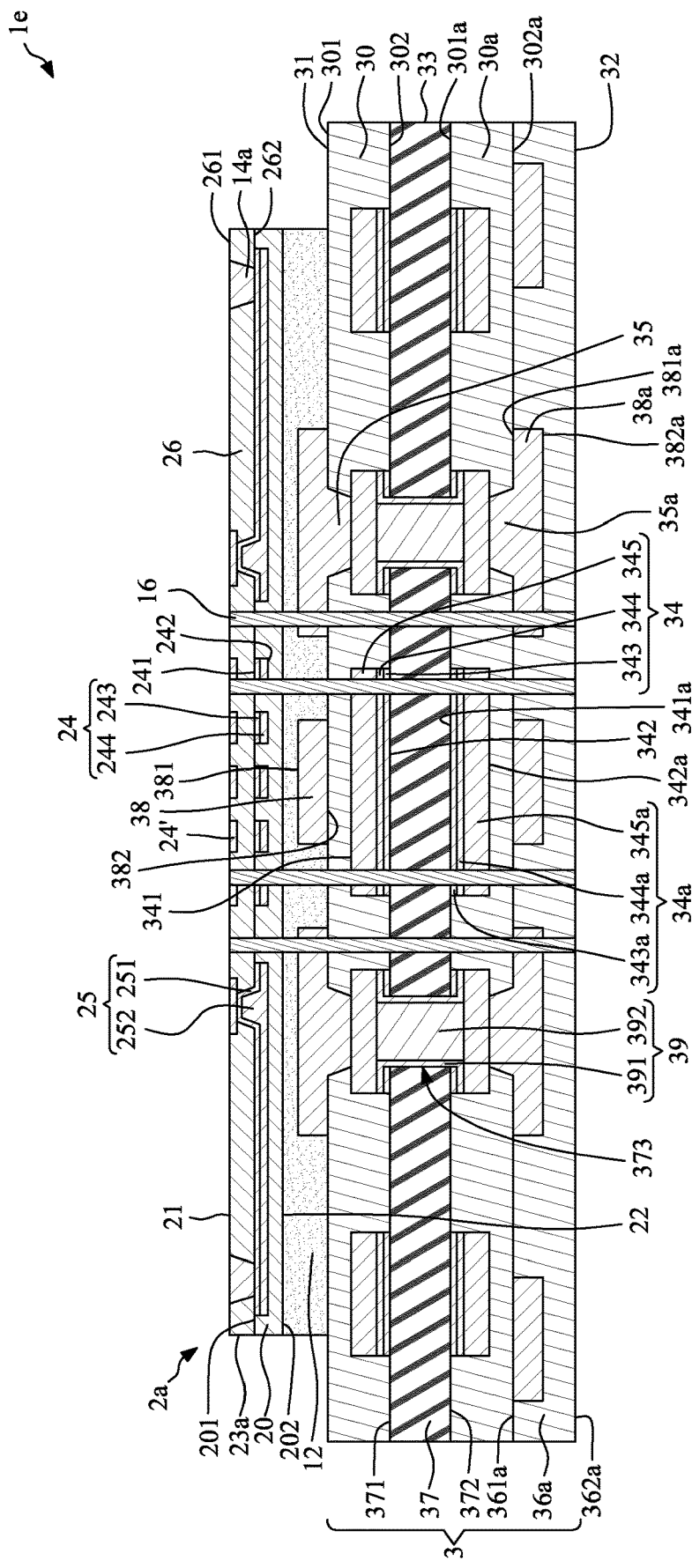
FIG. 8 illustrates a cross-sectional view of a wiring structure according to some embodiments of the present disclosure.

FIG. 8 illustrates a cross-sectional view of a wiring structure 1e according to some embodiments of the present disclosure. The wiring structure 1e is similar to the wiring structure 1 shown in FIG. 1, except that the first bonding wires 15a and the pad portion 384 of the lower conductive structure 3 are omitted, and a plurality of through vias 16 are further included. The through vias 16 extend through at least a portion of the first upper conductive structure 2a, the intermediate layer 12 and at least a portion of the lower conductive structure 3. As shown in FIG. 8, the through vias 16 extend between the bottom surface 32 of the lower conductive structure 3 and the top surface 21 of the first upper conductive structure 2a, and are disposed in a non-bonding area. The through vias 16 may extend through and/or contact some circuit layers of the first upper conductive structure 2a and the lower conductive structure 3; thus, the first upper conductive structure 2a is electrically connected to the lower conductive structure 3 through the through vias 16. Each of the through vias 16 may be a monolithic structure, and a diameter of each of the through vias 16 may be about 1 mm. Through vias 16 may be formed by mechanical drilling, and each of the through vias 16 may have a substantially consistent width. In addition to being an electrical connection path, the through via 16 may be also a heat dissipation path.

Figure 9:
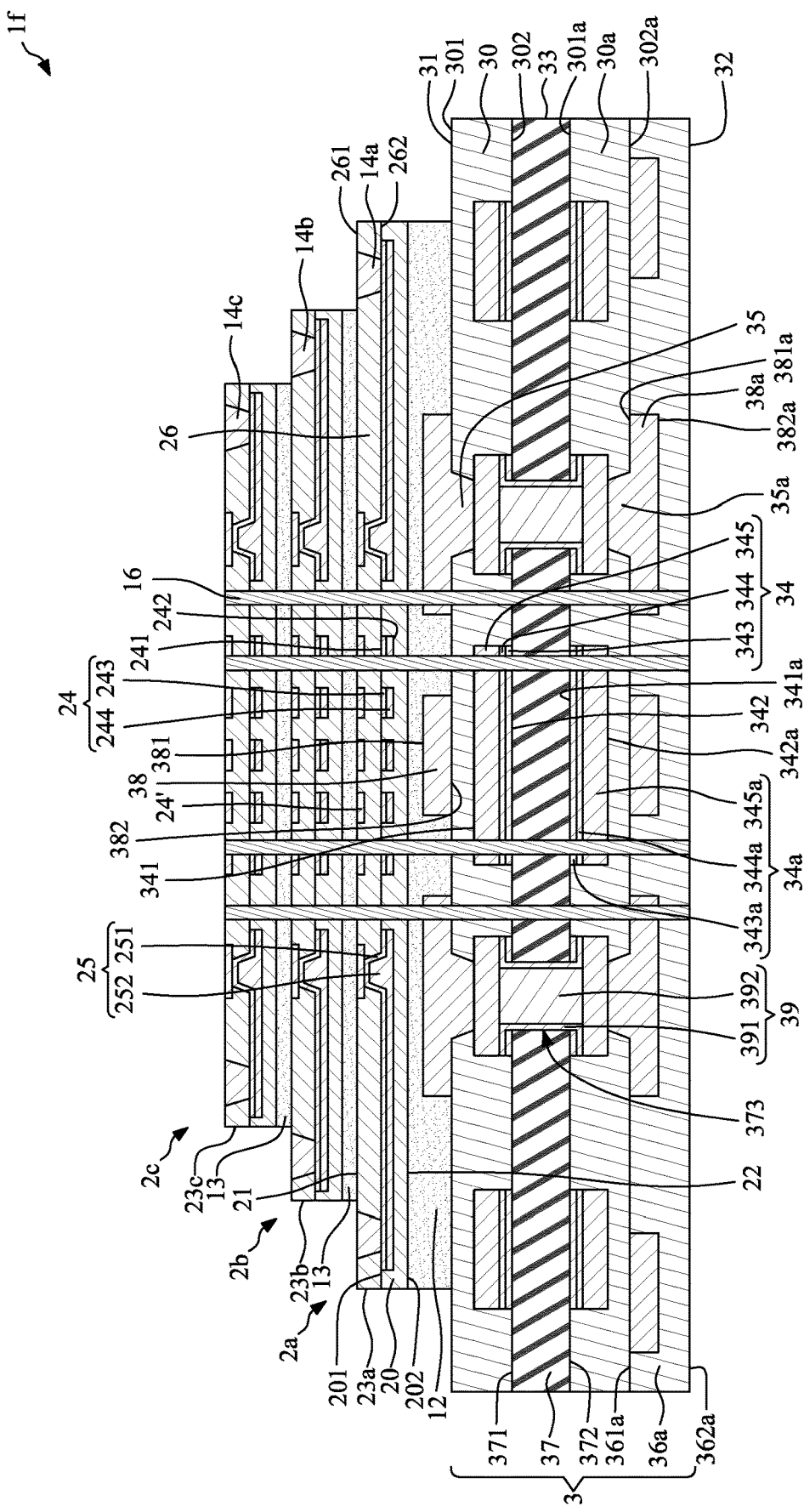
FIG. 9 illustrates a cross-sectional view of a wiring structure according to some embodiments of the present disclosure.

FIG. 9 illustrates a cross-sectional view of a wiring structure 1f according to some embodiments of the present disclosure. The wiring structure 1f is similar to the wiring structure 1b shown in FIG. 3, except that the first bonding wires 15a, the second bonding wires 15b and the pad portion 384 of the lower conductive structure 3 are omitted, and a plurality of through vias 16 are further included. The through vias 16 extend through at least a portion of the first upper conductive structure 2a, at least a portion of the second upper conductive structure 2b, at least a portion of the third upper conductive structure 2c, the intermediate layer 12 and at least a portion of the lower conductive structure 3. As shown in FIG. 9, the through vias 16 extend between the bottom surface 32 of the lower conductive structure 3 and the top surface of the third upper conductive structure 2c, and are disposed in a non-bonding area. The through vias 16 may extend through and/or contact some circuit layers of the first upper conductive structure 2a, the second upper conductive structure 2b, the third upper conductive structure 2c and the lower conductive structure 3; thus, the first upper conductive structure 2a, the second upper conductive structure 2b and the third upper conductive structure 2c are electrically connected to the lower conductive structure 3 through the through vias 16. In addition to being an electrical connection path, the through via 16 may be also a heat dissipation path.

Figure 10:
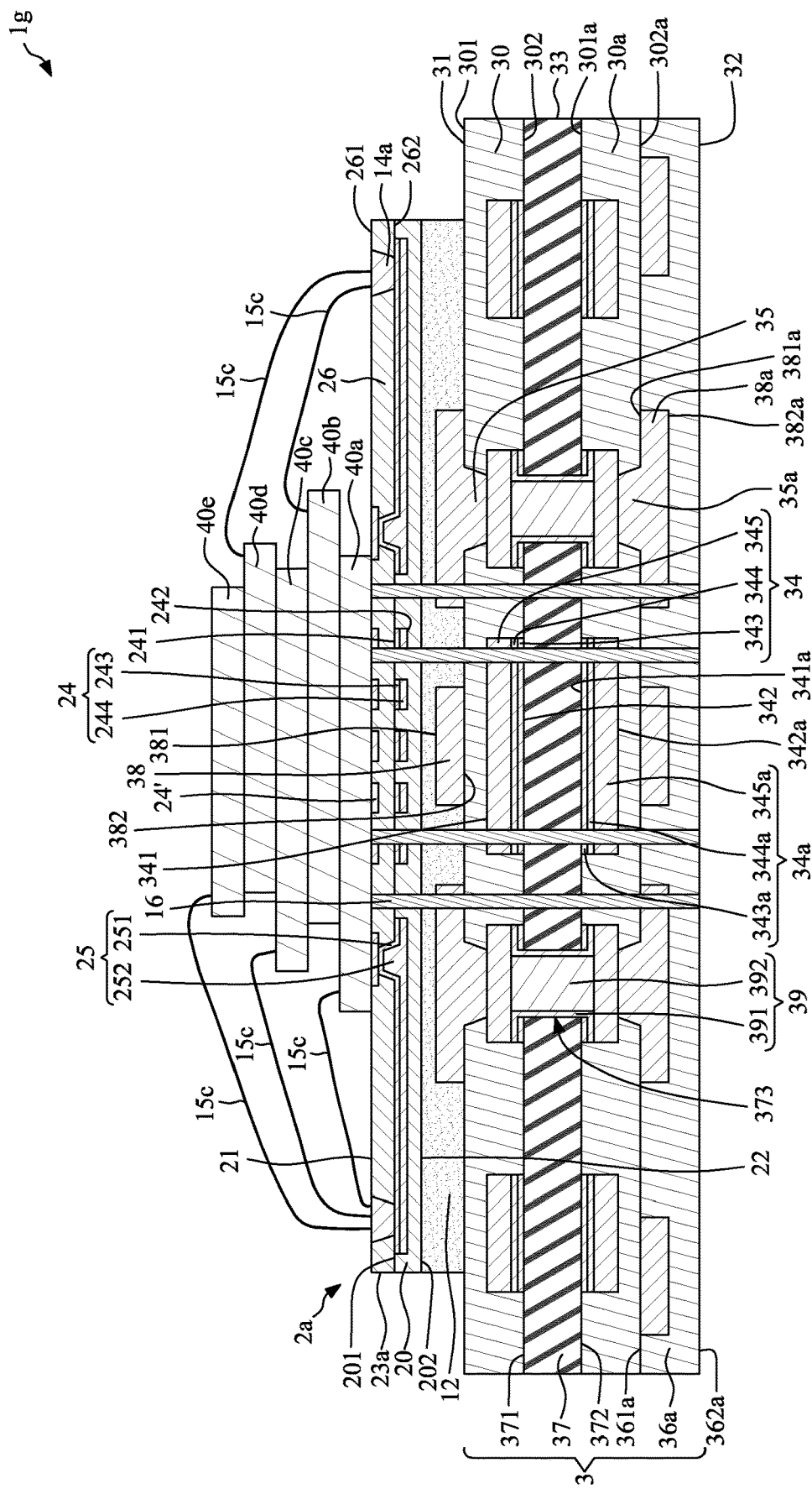
FIG. 10 illustrates a cross-sectional view of a wiring structure according to some embodiments of the present disclosure.

FIG. 10 illustrates a cross-sectional view of a wiring structure 1g according to some embodiments of the present disclosure. The wiring structure 1g is similar to the wiring structure 1c shown in FIG. 4, except that the first bonding wires 15a and the pad portion 384 of the lower conductive structure 3 are omitted, and a plurality of through vias 16 are further included. The through vias 16 extend through at least a portion of the first upper conductive structure 2a, the intermediate layer 12 and at least a portion of the lower conductive structure 3. As shown in FIG. 10, the through vias 16 extend between the bottom surface 32 of the lower conductive structure 3 and the top surface 21 of the first upper conductive structure 2a, and are disposed in a non-bonding area. The through vias 16 may extend through and/or contact some circuit layers of the first upper conductive structure 2a and the lower conductive structure 3; thus, the first upper conductive structure 2a is electrically connected to the lower conductive structure 3 through the through vias 16. In addition to being an electrical connection path, the through via 16 may be also a heat dissipation path. As shown in FIG. 10, the through vias 16 are disposed under the electronic devices (e.g., a first memory die 40a, a second memory die 40b, a third memory die 40c, a fourth memory die 40d and a fifth memory die 40e), and thermally connected to the electronic devices. Thus, the first memory die 40a may contact the through vias 16, and the heat generated by the electronic devices may be dissipated through the through vias 16.

Figure 11:
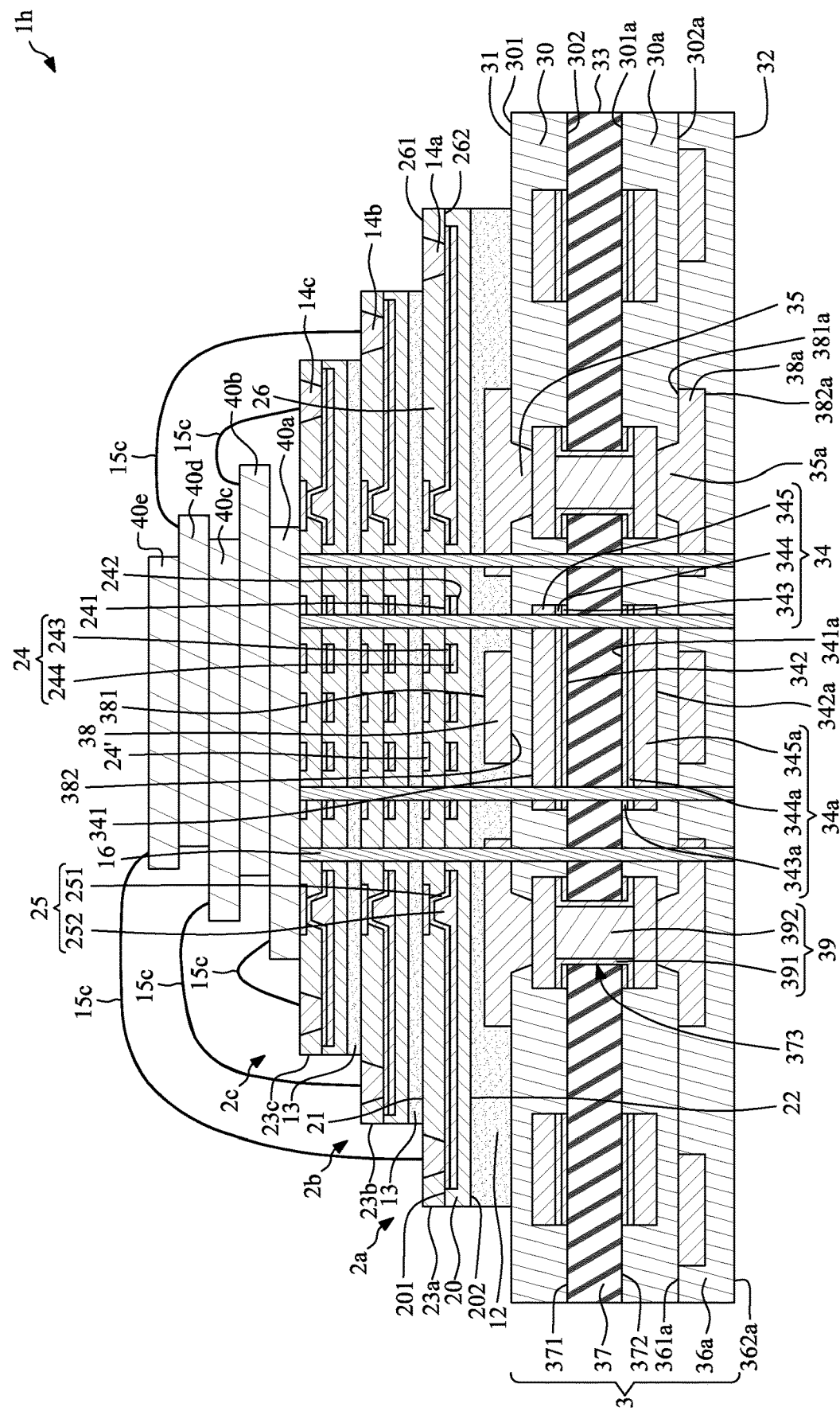
FIG. 11 illustrates a cross-sectional view of a wiring structure according to some embodiments of the present disclosure.

FIG. 11 illustrates a cross-sectional view of a wiring structure 1h according to some embodiments of the present disclosure. The wiring structure 1h is similar to the wiring structure 1d shown in FIG. 6, except that the first bonding wires 15a, the second bonding wires 15b and the pad portion 384 of the lower conductive structure 3 are omitted, and a plurality of through vias 16 are further included. The through vias 16 extend through at least a portion of the first upper conductive structure 2a, at least a portion of the second upper conductive structure 2b, at least a portion of the third upper conductive structure 2c, the intermediate layer 12 and at least a portion of the lower conductive structure 3. As shown in FIG. 11, the through vias 16 extend between the bottom surface 32 of the lower conductive structure 3 and the top surface of the third upper conductive structure 2c, and are disposed in a non-bonding area. The through vias 16 may extend through and/or contact some circuit layers of the first upper conductive structure 2a, the second upper conductive structure 2b, the third upper conductive structure 2c and the lower conductive structure 3; thus, the first upper conductive structure 2a, the second upper conductive structure 2b and the third upper conductive structure 2c are electrically connected to the lower conductive structure 3 through the through vias 16. In addition to being an electrical connection path, the through via 16 may be also a heat dissipation path. As shown in FIG. 11, the through vias 16 are disposed under the electronic devices (e.g., a first memory die 40a, a second memory die 40b, a third memory die 40c, a fourth memory die 40d and a fifth memory die 40e), and thermally connected to the electronic devices. Thus, the first memory die 40a may contact the through vias 16, and the heat generated by the electronic devices may be dissipated through the through vias 16.

FIG. 12 through FIG. 24 illustrate a method for manufacturing a wiring structure according to some embodiments of the present disclosure. In some embodiments, the method is for manufacturing the wiring structure 1 shown in FIG. 1.

Figure 12:
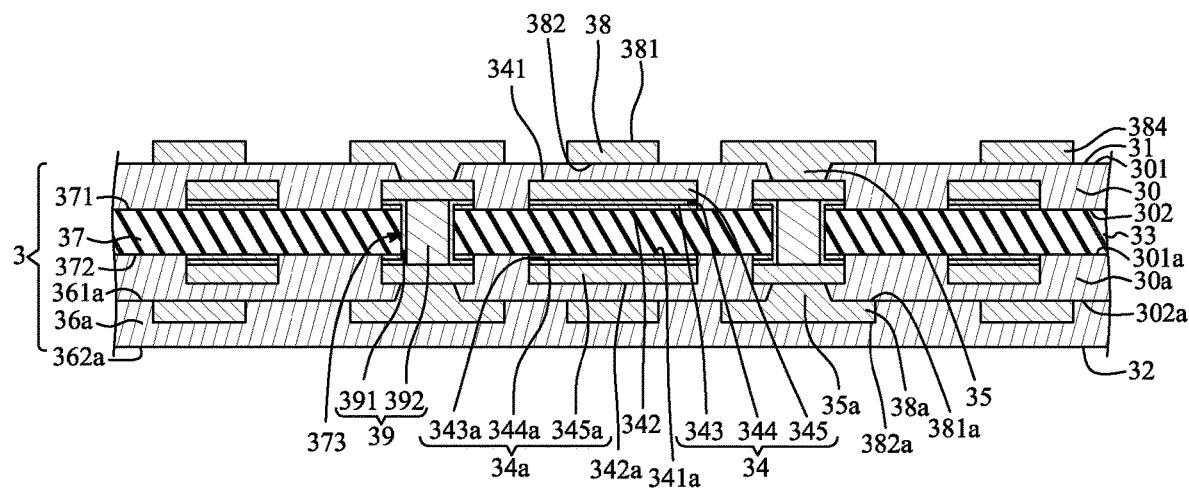
FIG. 12 illustrates one or more stages of an example of a method for manufacturing a wiring structure according to some embodiments of the present disclosure.

Referring to FIG. 12, a lower conductive structure 3 is provided. The lower conductive structure 3 includes a core portion 37, at least one dielectric layer (including, for example, one first upper dielectric layer 30, one first lower dielectric layer 30a and one second lower dielectric layer 36a) and at least one circuit layer (including, for example, one first upper circuit layer 34, one second upper circuit layer 38, one first lower circuit layer 34a and one second lower circuit layers 38a formed of a metal, a metal alloy, or other conductive material) in contact with the dielectric layer (e.g., the first upper dielectric layer 30, the first lower dielectric layer 30a and the second lower dielectric layer 36a). In some embodiments, the lower conductive structure 3 may be manufactured as follows.

The core portion 37 with a top copper foil and a bottom copper foil is provided. The core portion 37 may be in a wafer type, a panel type or a strip type. The core portion 37 has a top surface 371 and a bottom surface 372 opposite to the top surface 371. The top copper foil is disposed on the top surface 371 of the core portion 37, and the bottom copper foil is disposed on the bottom surface 372 of the core portion 37. Then, a plurality of through holes 373 are formed to extend through the core portion 37, the top copper foil and the bottom copper foil by a drilling technique (such as laser drilling or mechanical drilling) or other suitable techniques.

Then, a second metallic layer is formed or disposed on the top copper foil, the bottom copper foil and side walls of the first through holes 373 by a plating technique or other suitable techniques. A portion of the second metallic layer on the side wall of each first through hole 373 defines a central through hole. Then, an insulation material 392 is disposed to fill the central through hole defined by the second metallic layer. Then, a top third metallic layer and a bottom third metallic layer are formed or disposed on the second metallic layer by a plating technique or other suitable techniques. The third metallic layers cover the insulation material 392. Then, the top copper foil, the second metallic layer and the top third metallic layer are patterned to form the first upper circuit layer 34. Meanwhile, the bottom copper foil, the second metallic layer and the bottom third metallic layer are patterned to form the first lower circuit layer 34a. Meanwhile, portions of the second metallic layer and the insulation material 392 that are disposed in the through hole 373 form an interconnection via 39. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a portion of the top copper foil. The second metallic layer 344 is disposed on the first metal layer 343, and may be a plated copper layer formed from the second metallic layer. The third metallic layer 345 is disposed on the second metallic layer 344, and may be another plated copper layer formed from the top third metallic layer.

In some embodiments, the first lower circuit layer 34a is formed or disposed on the bottom surface 372 of the core portion 37. The first lower circuit layer 34a may include a first metallic layer 343a, a second metallic layer 344a and a third metallic layer 345a. The first metallic layer 343a is disposed on the bottom surface 372 of the core portion 37, and may be formed from a portion of the bottom copper foil. The second metallic layer 344a is disposed on the first metallic layer 343a, and may be a plated copper layer formed from the second metallic layer. The third metallic layer 345a is disposed on the second metallic layer 344a, and may be another plated copper layer formed from the bottom third metallic layer. The interconnection via 39 includes a base metallic layer 391 formed from the second metallic layer and the insulation material 392. In some embodiments, the interconnection via 39 may include a bulk metallic material that fills the through hole 373. The interconnection via 39 electrically connects the first upper circuit layer 34 and the first lower circuit layer 34a.

Then, the first upper dielectric layer 30 is formed or disposed on the top surface 371 of the core portion 37 to cover the top surface 371 of the core portion 37 and the first upper circuit layer 34 by a lamination technique or other suitable techniques. Meanwhile, the first lower dielectric layer 30a is formed or disposed on the bottom surface 372 of the core portion 37 to cover the bottom surface 372 of the core portion 37 and the first lower circuit layer 34a by a lamination technique or other suitable techniques.

Then, at least one through hole is formed to extend through the first upper dielectric layer 30 to expose a portion of the first upper circuit layer 34 by a drilling technique or other suitable techniques. Meanwhile, at least one through hole is formed to extend through the first lower dielectric layer 30a to expose a portion of the first lower circuit layer 34a by a drilling technique or other suitable techniques. Then, a top metallic layer is formed on the first upper dielectric layer 30 and in the through hole to form then upper interconnection via 35 by a plating technique or other suitable techniques. Meanwhile, a bottom metallic layer is formed on the first lower dielectric layer 30a and in the through hole to form the lower interconnection via 35a by a plating technique or other suitable techniques. As shown in FIG. 12, the upper interconnection via 35 tapers downwardly, and the lower interconnection via 35a tapers upwardly.

Then, the top metallic layer is patterned to form the second upper circuit layer 38. Meanwhile, the bottom metallic layer 60 is patterned to form the second lower circuit layer 38a. Then, the second lower dielectric layer 36a is formed or disposed on the bottom surface of the first lower dielectric layer 30a to cover the first lower dielectric layer 30a and the second lower circuit layer 38a by a lamination technique or other suitable techniques. Meanwhile, the lower conductive structure 3 is formed. Then, an electrical property (such as open circuit/short circuit) of the lower conductive structure 3 may be tested.

Figure 13:
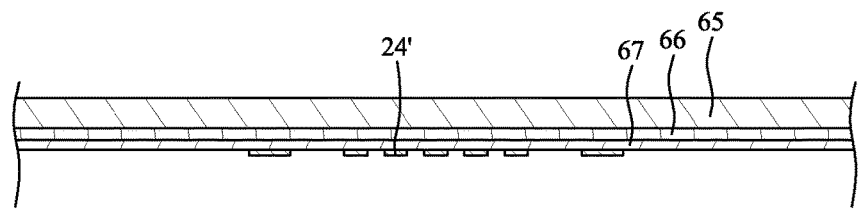
FIG. 13 illustrates one or more stages of an example of a method for manufacturing a wiring structure according to some embodiments of the present disclosure.

Referring to FIG. 13 through FIG. 22, a first upper conductive structure 2a is provided. The first upper conductive structure 2a is manufactured as follows. Referring to FIG. 13, a carrier 65 is provided. The carrier 65 may be a glass carrier, and may be in a wafer type, a panel type or a strip type. Then, a release layer 66 is coated on a bottom surface of the carrier 65. Then, a conductive layer 67 (e.g., a seed layer) is formed or disposed on the release layer 66 by a physical vapor deposition (PVD) technique or other suitable techniques. Then, a second circuit layer 24' is formed on the conductive layer 67.

Figure 14:
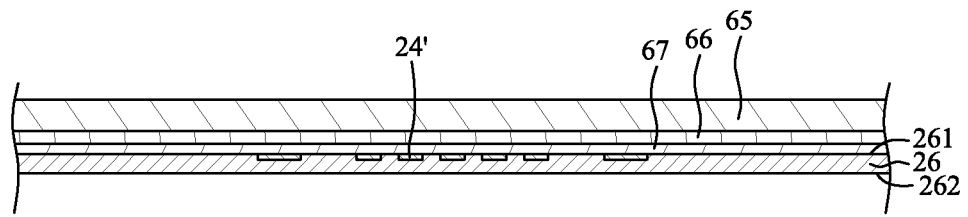
FIG. 14 illustrates one or more stages of an example of a method for manufacturing a wiring structure according to some embodiments of the present disclosure.

Referring to FIG. 14, a second dielectric layer 26 is formed on the conductive layer 67 by a coating technique or other suitable techniques to cover the second circuit layer 24'.

Figure 15:
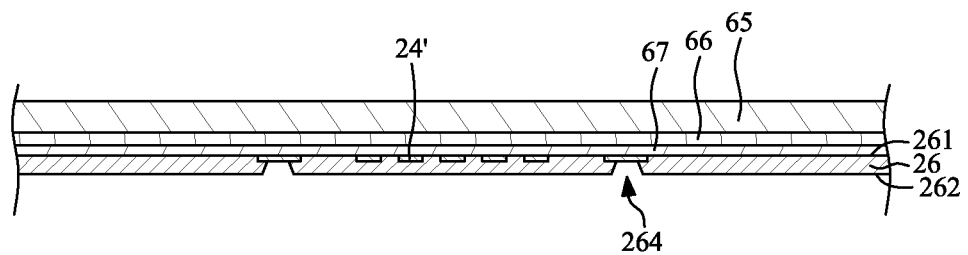
FIG. 15 illustrates one or more stages of an example of a method for manufacturing wiring structure according to some embodiments of the present disclosure.

Referring to FIG. 15, at least one through hole 264 is formed to extend through the second dielectric layer 26 to expose a portion of the second circuit layer 24' by an exposure and development technique or other suitable techniques.

Figure 16:
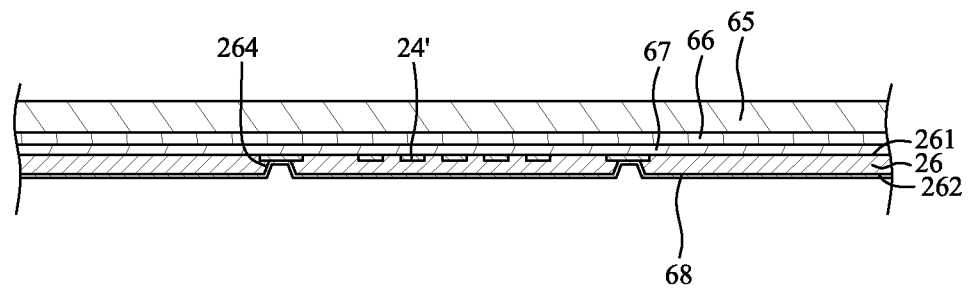
FIG. 16 illustrates one or more stages of an example of a method for manufacturing a wiring structure according to some embodiments of the present disclosure.

Referring to FIG. 16, a seed layer 68 is formed on a bottom surface 262 of the second dielectric layer 26 and in the through hole 264 by a PVD technique or other suitable techniques.

Figure 17:
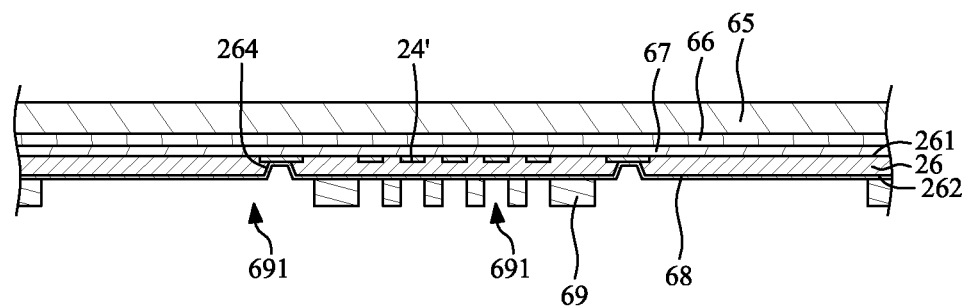
FIG. 17 illustrates one or more stages of an example of a method for manufacturing a wiring structure according to some embodiments of the present disclosure.

Referring to FIG. 17, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 18:
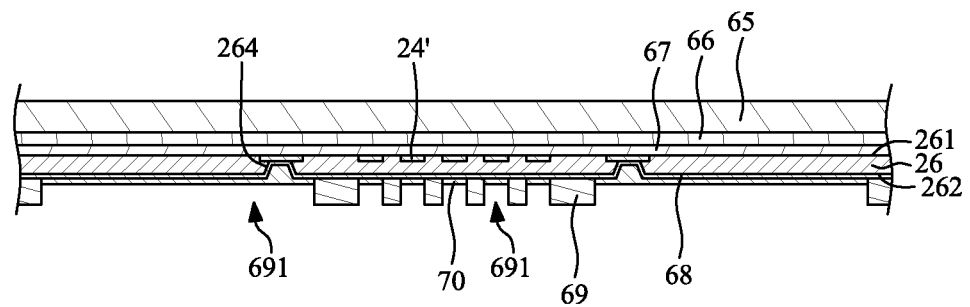
FIG. 18 illustrates one or more stages of an example of a method for manufacturing a wiring structure according to some embodiments of the present disclosure.

Referring to FIG. 18, a conductive material 70 (e.g., a metallic material) is disposed in the openings 691 of the photoresist layer 69 and on the seed layer 68 by a plating technique or other suitable techniques.

Figure 19:
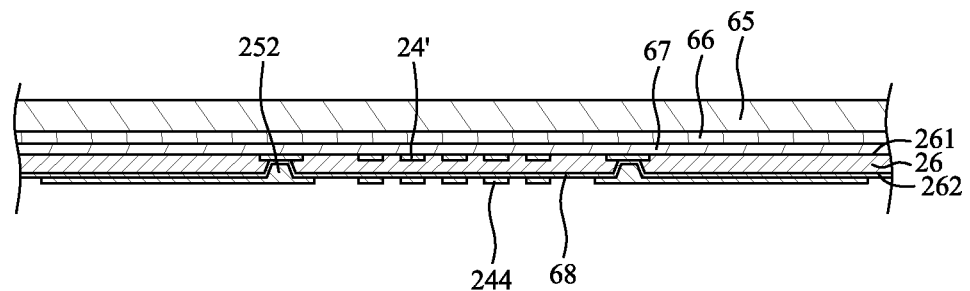
FIG. 19 illustrates one or more stages of an example of a method for manufacturing a wiring structure according to some embodiments of the present disclosure.

Referring to FIG. 19, the photoresist layer 69 is removed by a stripping technique or other suitable techniques.

Figure 20:
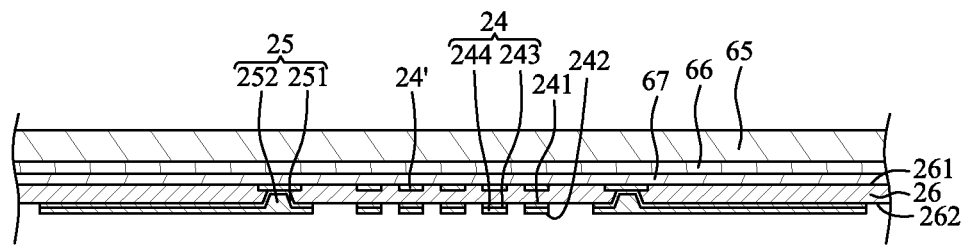
FIG. 20 illustrates one or more stages of an example of a method for manufacturing a wiring structure according to some embodiments of the present disclosure.

Referring to FIG. 20, portions of the seed layer 68 that are not covered by the conductive material 70 are removed by an etching technique or other suitable techniques. Meanwhile, a first circuit layer 24 and at least one inner via 25 are formed. The first circuit layer 24 may be a fan-out circuit layer or an RDL, and an L/S of the first circuit layer 24 may be less than or equal to about 2 µm/about 2 µm, or less than or equal to about 1.8 µm/about 1.8 µm. The first circuit layer 24 is disposed on the bottom surface 262 of the second dielectric layer 26. In some embodiments, the first circuit layer 24 may include a seed layer 243 formed from the seed layer 68 and a conductive material 244 disposed on the seed layer 243 and formed from the conductive material 70. The inner via 25 is disposed in the through hole 264 of the second dielectric layer 26. In some embodiments, the inner via 25 may include a seed layer 251 and a conductive material 252 disposed on the seed layer 251. The inner via 25 tapers upwardly.

Figure 21:
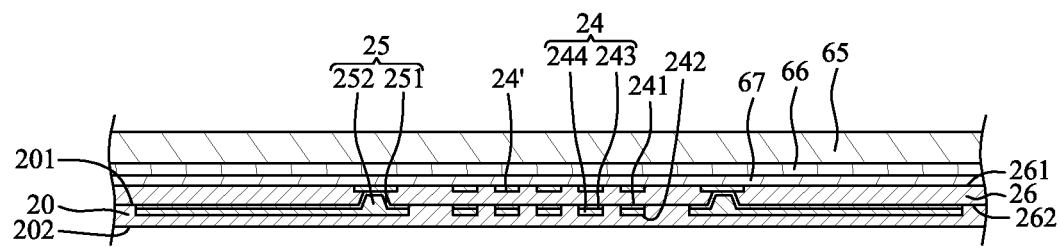
FIG. 21 illustrates one or more stages of an example of a method for manufacturing a wiring structure according to some embodiments of the present disclosure.

Referring to FIG. 21, a first dielectric layer 20 is formed or disposed on the second dielectric layer 26 to cover the first circuit layer 24.

Figure 22:
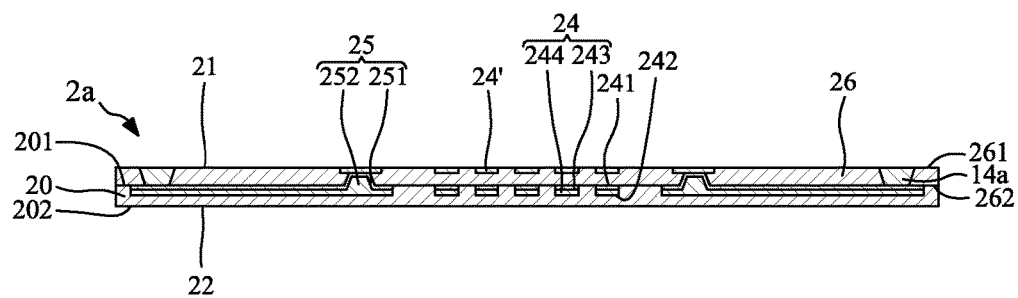
FIG. 22 illustrates one or more stages of an example of a method for manufacturing a wiring structure according to some embodiments of the present disclosure.

Referring to FIG. 22, the carrier 65, the release layer 66 and the conductive layer 67 are removed. Then, at least one through hole is formed in the second dielectric layer 26 to expose a portion of the first circuit layer 24. Then, a metallic material fills the through hole of the second dielectric layer 26 to form at least one bonding portion 14a. In some embodiments, the bonding portion 14a extends through the second dielectric layer 26 and contacts the first circuit layer 24. Further, the bonding portion 14a tapers downwardly; that is, a size of a top portion of the bonding portion 14a is greater than a size of a bottom portion of the bonding portion 14a. In some embodiments, the bonding portion 14a is a monolithic structure or a one-piece structure having a homogeneous material composition. The bonding portion 14a may be bonding pad such as a finger pad that is used for wire bonding.

Then, the dielectric layers (including, the first dielectric layer 20 and the second dielectric layer 26) are cured. Then, a singulation process is conducted to form the first upper conductive structure 2a. Then, an electrical property (such as open circuit/short circuit) of the first upper conductive structure 2a may be tested.

Figure 23:
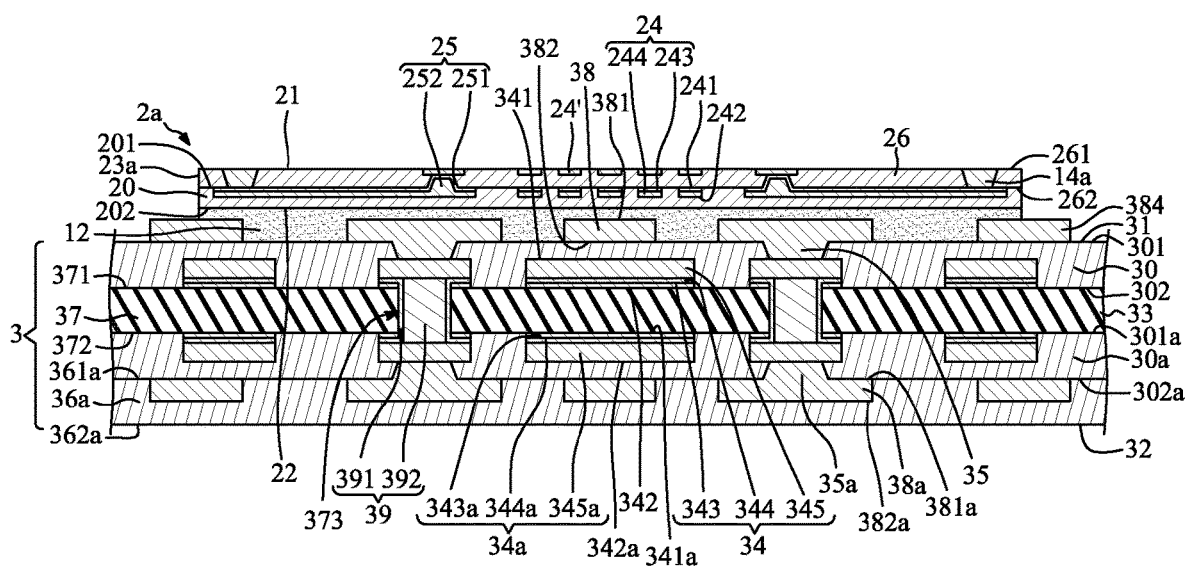
FIG. 23 illustrates one or more stages of an example of a method for manufacturing a wiring structure according to some embodiments of the present disclosure.

Referring to FIG. 23, the first upper conductive structure 2a is attached to the lower conductive structure 3 through an adhesive layer 12. The adhesive layer 12 does not fully cover the bonding portion (e.g., the pad portion 384) of the lower conductive structure 3. The bonding portion 14a of the first upper conductive structure 2a faces upwardly. In some embodiments, the known good first upper conductive structure 2a is attached to the known good lower conductive structure 3. Then, the adhesive layer 12 is cured to form an intermediate layer 12. In some embodiments, the first upper conductive structure 2a may be pressed onto the lower conductive structure 3. Thus, the thickness of the intermediate layer 12 is determined by the gap between the first upper conductive structure 2a and the lower conductive structure 3.

Figure 24:
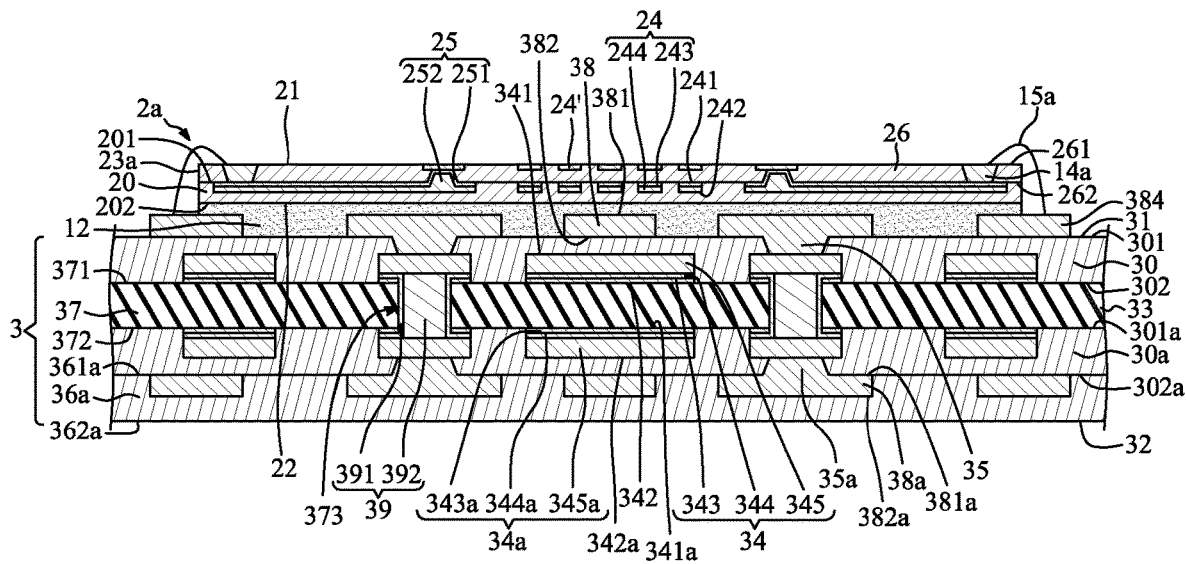
FIG. 24 illustrates one or more stages of an example of a method for manufacturing a wiring structure according to some embodiments of the present disclosure.

Referring to FIG. 24, a plurality of first bonding wires 15a are formed to connect the bonding portion 14a of the first upper conductive structure 2a and the bonding portion (e.g., the pad portion 384) of the second upper circuit layer 38 of the lower conductive structure 3. Thus, the first upper conductive structure 2a is electrically connected to the lower conductive structure 3 through the first bonding wires 15a. Then, the lower conductive structure 3 is singulated to from a wiring structure 1 as shown in FIG. 1.

Figure 25:
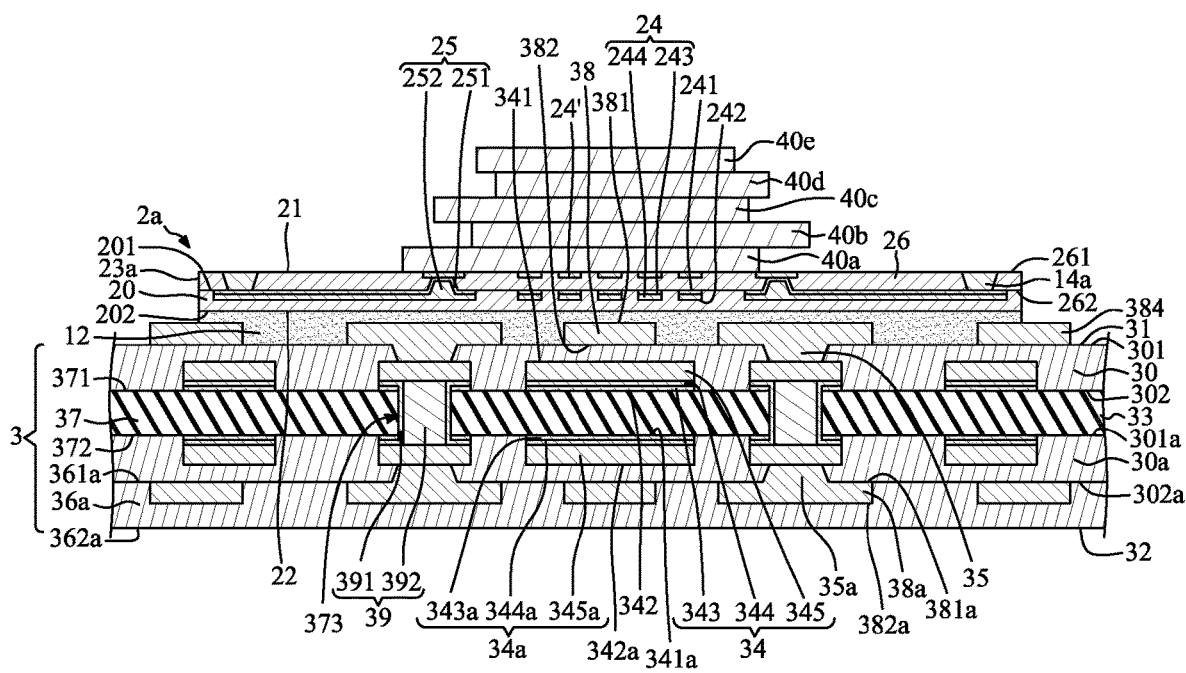
FIG. 25 illustrates one or more stages of an example of a method for manufacturing a wiring structure according to some embodiments of the present disclosure.
Figure 26:
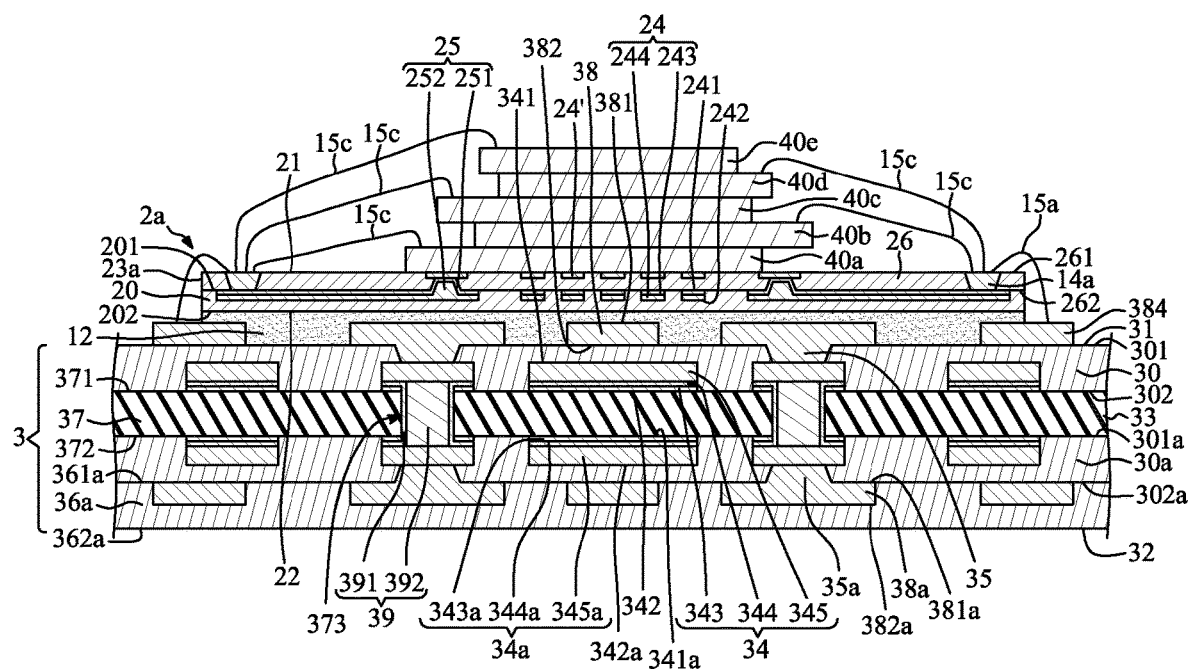
FIG. 26 illustrates one or more stages of an example of a method for manufacturing a wiring structure according to some embodiments of the present disclosure.

FIG. 25 through FIG. 26 illustrate a method for manufacturing a wiring structure according to some embodiments of the present disclosure. In some embodiments, the method is for manufacturing the wiring structure 1c shown in FIG. 4 and FIG. 5. The initial stages of the illustrated process are the same as, or similar to, the stages illustrated in FIG. 12 to FIG. 23. FIG. 25 depicts a stage subsequent to that depicted in FIG. 23.

Referring to FIG. 25, a plurality of electronic devices (e.g., a first memory die 40a, a second memory die 40b, a third memory die 40c, a fourth memory die 40d and a fifth memory die 40e) are stacked on one another, and are stacked on and adhered to the first upper conductive structure 2a. Positions of the electronic devices (e.g., the first memory die 40a, the second memory die 40b, the third memory die 40c, the fourth memory die 40d and the fifth memory die 40e) may be shifted or laterally displaced from each other so as to facilitate a wire bonding process. For example, the second memory die 40b is shifted from the first memory die 40a to expose the bonding portions of the first memory die 40a. Sizes of the electronic devices (e.g., the first memory die 40a, the second memory die 40b, the third memory die 40c, the fourth memory die 40d and the fifth memory die 40e) may be same as or different from each other.

Referring to FIG. 26, a plurality of first bonding wires 15a are formed to connect the bonding portion 14a of the first upper conductive structure 2a and the bonding portion (e.g., the pad portion 384) of the second upper circuit layer 38 of the lower conductive structure 3. Thus, the first upper conductive structure 2a is electrically connected to the lower conductive structure 3 through the first bonding wires 15a. In addition, a plurality of third bonding wires 15c are formed for connecting the bonding portions of the electronic devices (e.g., the first memory die 40a, the second memory die 40b, the third memory die 40c, the fourth memory die 40d and the fifth memory die 40e) and the bonding portion 14a of the first upper conductive structure 2a. As shown in FIG. 5, the first upper conductive structure 2a may include a plurality of bonding areas 27 (e.g., a first bonding area 271, a second bonding area 272, a third bonding area 273, a fourth bonding area 274, a fifth bonding area 275 and a sixth bonding area 276). Each of the bonding areas 27 (e.g., the first bonding area 271, the second bonding area 272, the third bonding area 273, the fourth bonding area 274, the fifth bonding area 275 and the sixth bonding area 276) includes a plurality of bonding portions 14a. In some embodiments, the first memory die 40a is electrically connected to the bonding portions 14a in the first bonding area 271 through the third bonding wires 15c. The second memory die 40b is electrically connected to the bonding portions 14a in the second bonding area 272 through the third bonding wires 15c. The third memory die 40c is electrically connected to the bonding portions 14a in the third bonding area 273 through the third bonding wires 15c. The fourth memory die 40d is electrically connected to the bonding portions 14a in the fourth bonding area 274 through the third bonding wires 15c. The fifth memory die 40e is electrically connected to the bonding portions 14a in the fifth bonding area 275 through the third bonding wires 15c. In addition, the bonding portions 14a in the sixth bonding area 276 are electrically connected to the pad portion 384 of the lower conductive structure 3 through the first bonding wires 15a. Then, the lower conductive structure 3 is singulated to form a wiring structure 1c as shown in FIG. 4 and FIG. 5.

Figure 27:
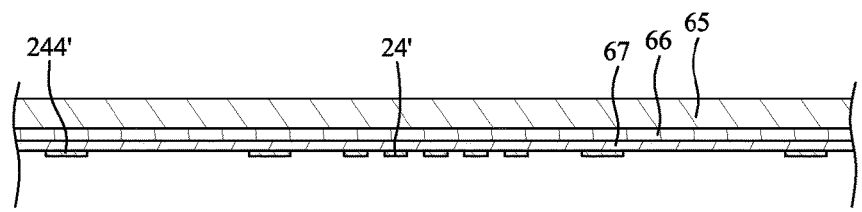
FIG. 27 illustrates one or more stages of an example of a method for manufacturing a wiring structure according to some embodiments of the present disclosure.

FIG. 27 through FIG. 33 illustrate a method for manufacturing a wiring structure according to some embodiments of the present disclosure. In some embodiments, the method is for manufacturing the wiring structure 1a shown in FIG. 2. The initial stage of the illustrated process is the same as, or similar to, the stages illustrated in FIG. 12. FIG. 27 depicts a stage subsequent to that depicted in FIG. 12.

Referring to FIG. 27, a carrier 65 is provided. The carrier 65 may be a glass carrier, and may be in a wafer type, a panel type or a strip type. Then, a release layer 66 is coated on a bottom surface of the carrier 65. Then, a conductive layer 67 (e.g., a seed layer) is formed or disposed on the release layer 66 by a PVD technique or other suitable techniques. Then, a second circuit layer 24' is formed on the conductive layer 67. The second circuit layer 24' includes a pad portion 244'.

Figure 28:
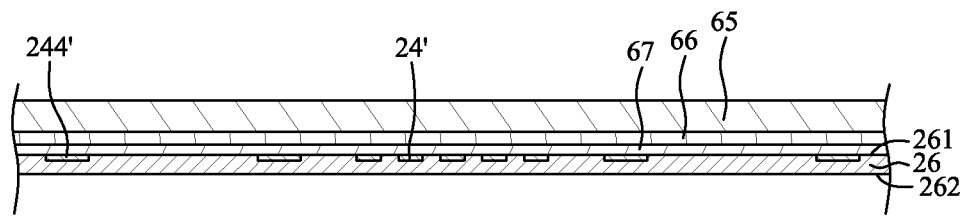
FIG. 28 illustrates one or more stages of an example of a method for manufacturing a wiring structure according to some embodiments of the present disclosure.

Referring to FIG. 28, a second dielectric layer 26 is formed on the conductive layer 67 by a coating technique or other suitable techniques to cover the second circuit layer 24'.

Figure 29:
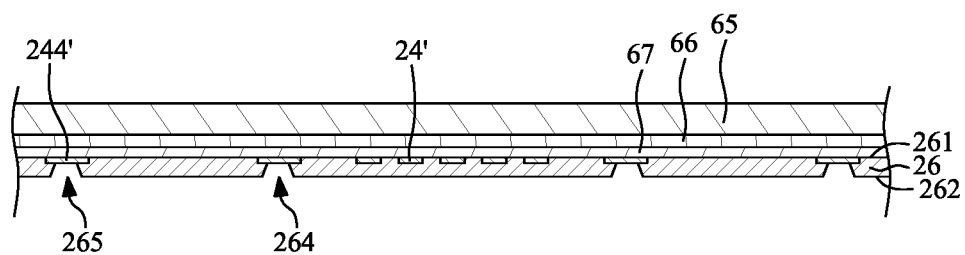
FIG. 29 illustrates one or more stages of an example of a method for manufacturing wiring structure according to some embodiments of the present disclosure.

Referring to FIG. 29, at least one through hole 264 and at least one through hole 265 are formed to extend through the second dielectric layer 26 to expose a portion of the second circuit layer 24' and a portion of the pad portion 244', respectively, by an exposure and development technique or other suitable techniques.

Figure 30:
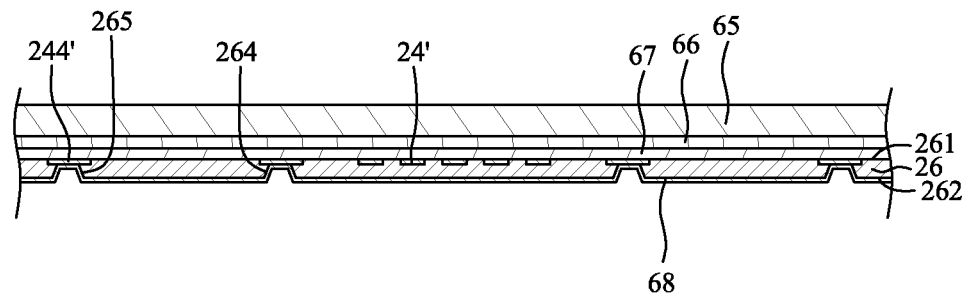
FIG. 30 illustrates one or more stages of an example of a method for manufacturing a wiring structure according to some embodiments of the present disclosure.

Referring to FIG. 30, a seed layer 68 is formed on a bottom surface 262 of the second dielectric layer 26 and in the through holes 264, 265 by a PVD technique or other suitable techniques.

Figure 31:
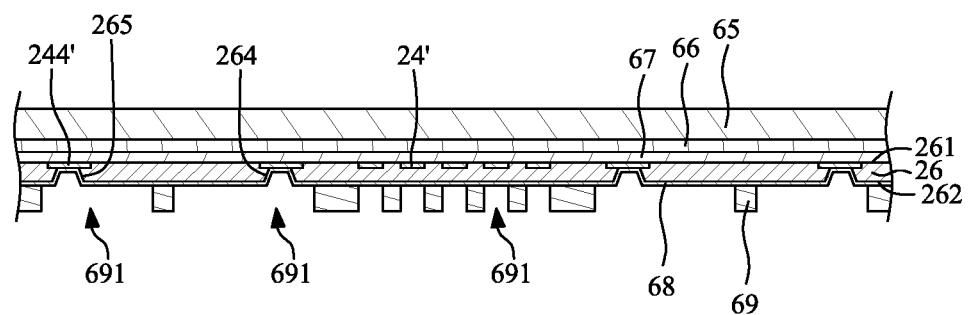
FIG. 31 illustrates one or more stages of an example of a method for manufacturing a wiring structure according to some embodiments of the present disclosure.

Referring to FIG. 31, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. The openings 691 of the photoresist layer 69 correspond to, and are aligned with, the through holes 264, 265 of the second dielectric layer 26.

Figure 32:
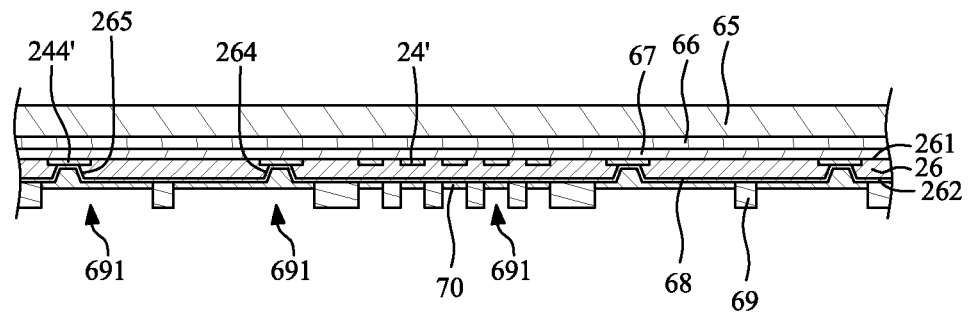
FIG. 32 illustrates one or more stages of an example of a method for manufacturing a wiring structure according to some embodiments of the present disclosure.

Referring to FIG. 32, a conductive material 70 (e.g., a metallic material) is disposed in the openings 691 of the photoresist layer 69 and on the seed layer 68 by a plating technique or other suitable techniques.

Figure 33:
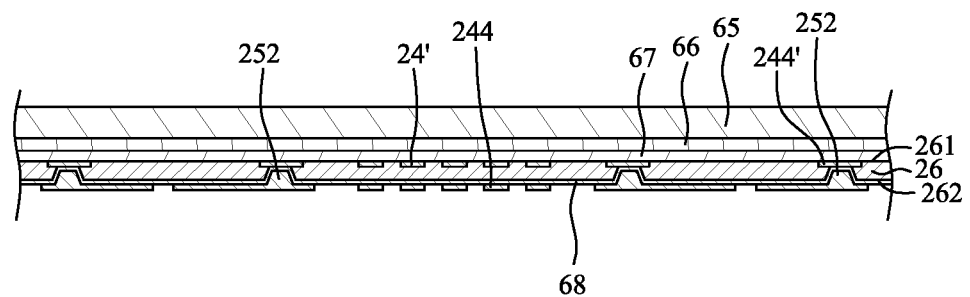
FIG. 33 illustrates one or more stages of an example of a method for manufacturing a wiring structure according to some embodiments of the present disclosure.

Referring to FIG. 33, the photoresist layer 69 is removed by a stripping technique or other suitable techniques.

Figure 34:
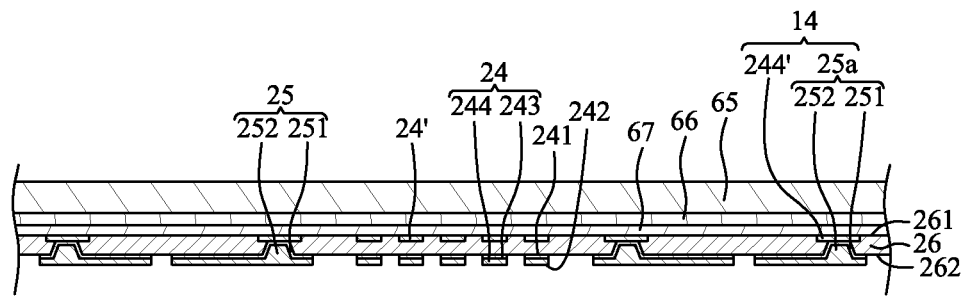
FIG. 34 illustrates one or more stages of an example of a method for manufacturing a wiring structure according to some embodiments of the present disclosure.

Referring to FIG. 34, portions of the seed layer 68 that are not covered by the conductive material 70 are removed by an etching technique or other suitable techniques. Meanwhile, a first circuit layer 24, at least one inner via 25 and least one via portion 25a are formed. The inner via 25 is disposed in the through hole 264 of the second dielectric layer 26. In some embodiments, the inner via 25 may include a seed layer 251 and a conductive material 252 disposed on the seed layer 251. The inner via 25 tapers upwardly. In addition, a top portion of the via portion 25a contacts and/or electrically connects the pad portion 244' of the second circuit layer 24'. In some embodiments, the via portion 25a may include a seed layer 251 and a conductive material 252 (e.g., a metallic material) disposed on the seed layer 251. In some embodiments, the via portion 25a and the first circuit layer 24 may be formed integrally as a monolithic or one-piece structure. The via portion 25a tapers upwardly. Thus, a tapering direction of the inner via 25 is the same as a tapering direction of the via portion 25a. The pad portion 244' and the via portion 25a are collectively to configure to form a bonding portion 14.

Figure 35:
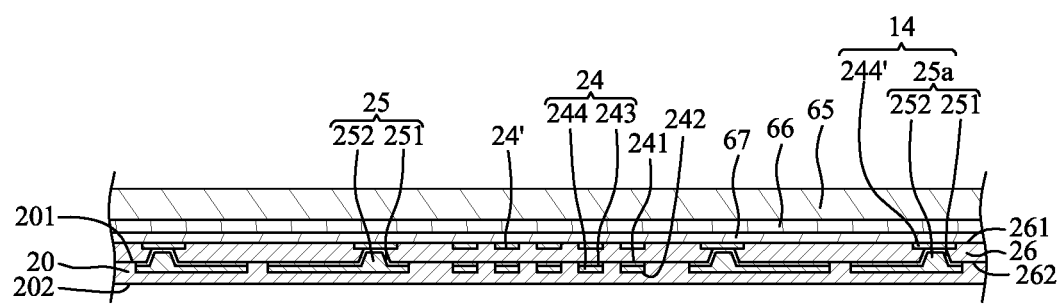
FIG. 35 illustrates one or more stages of an example of a method for manufacturing a wiring structure according to some embodiments of the present disclosure.

Referring to FIG. 35, a first dielectric layer 20 is formed or disposed on the second dielectric layer 26 to cover the first circuit layer 24. Then, the dielectric layers (including, the first dielectric layer 20 and the second dielectric layer 26) are cured. Then, the carrier 65, the release layer 66 and the conductive layer 67 are removed. Then, a singulation process is conducted to form the first upper conductive structure 2. Then, an electrical property (such as open circuit/short circuit) of the first upper conductive structure 2 may be tested.

Then, the first upper conductive structure 2 is attached to the lower conductive structure 3 through an adhesive layer 12. The adhesive layer 12 does not fully cover the bonding portion (e.g., the pad portion 384) of the lower conductive structure 3. The bonding portion 14 of the first upper conductive structure 2 faces upwardly. In some embodiments, the known good first upper conductive structure 2 is attached to the known good lower conductive structure 3. Then, the adhesive layer 12 is cured to form an intermediate layer 12.

Then, a plurality of first bonding wires 15a are formed to connect the pad portion 244' of the bonding portion 14 of the first upper conductive structure 2 and the bonding portion (e.g., the pad portion 384) of the second upper circuit layer 38 of the lower conductive structure 3. In some embodiments, the pad portion 244' of the second circuit layer 24' of the first upper conductive structure 2 may be omitted, and the top portion of the via portion 25a may be exposed form the top surface 261 of the second dielectric layer 26. Thus, the via portion 25a is the bonding portion 14, an end of the first bonding wires 15a may contact and/or electrically connect the top portion of the via portion 25a directly. Then, the lower conductive structure 3 is singulated to from a wiring structure 1a as shown in FIG. 2.

Figure 36:
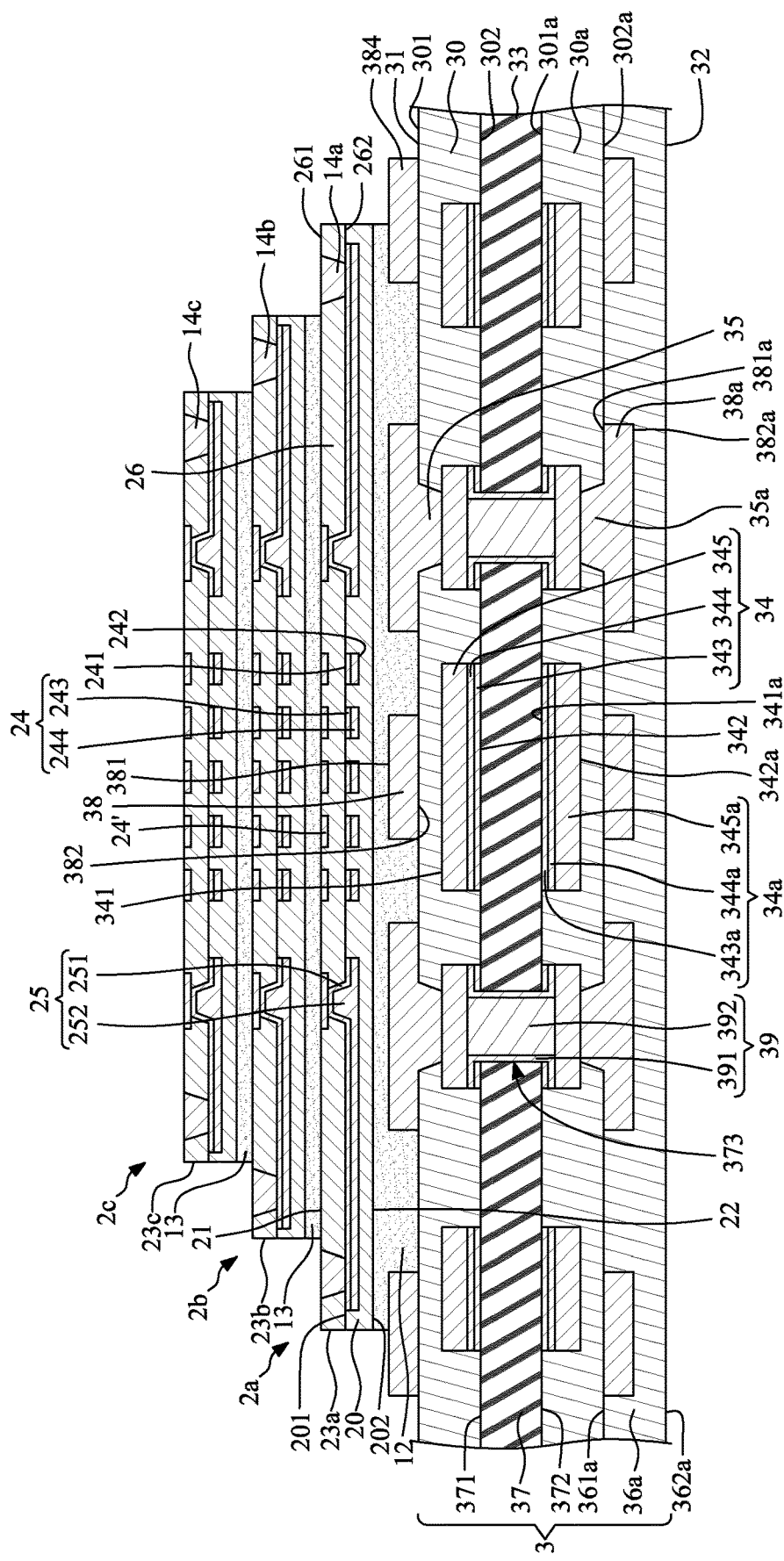
FIG. 36 illustrates one or more stages of an example of a method for manufacturing a wiring structure according to some embodiments of the present disclosure.

FIG. 36 illustrates a method for manufacturing a wiring structure according to some embodiments of the present disclosure. In some embodiments, the method is for manufacturing the wiring structure 1b shown in FIG. 3. The initial stages of the illustrated process are the same as, or similar to, the stages illustrated in FIG. 12 to FIG. 23. FIG. 36 depicts a stage subsequent to that depicted in FIG. 23.

Referring to FIG. 36, a second upper conductive structure 2b is stacked on and attached to the first upper conductive structure 2a through an intervening layer 13, and a third upper conductive structure 2c is stacked on and attached to the second upper conductive structure 2b through an intervening layer 13. The structures of the second upper conductive structure 2b and the third upper conductive structure 2c may be substantially same as the structure of the first upper conductive structure 2a. The sizes of the upper conductive structures (e.g., the first upper conductive structure 2a, the second upper conductive structure 2b and the third upper conductive structure 2c) are different from each other. For example, from a top view, the size of the second upper conductive structure 2b is smaller than the size of the first upper conductive structure 2a, and the size of the third upper conductive structure 2c is smaller than the size of the second upper conductive structure 2b.

Then, a plurality of second bonding wires 15b are formed to connect the bonding portions of two adjacent upper conductive structures. For example, some of the second bonding wires 15b connect the bonding portion 14b of the second upper conductive structure 2b and the bonding portion 14a of the first upper conductive structure 2a. Some of the second bonding wires 15b connect the bonding portion 14c of the third upper conductive structure 2c and the bonding portion 14b of the second upper conductive structure 2b.

Then, the lower conductive structure 3 is singulated to form a wiring structure 1b as shown in FIG. 3.

Figure 37:
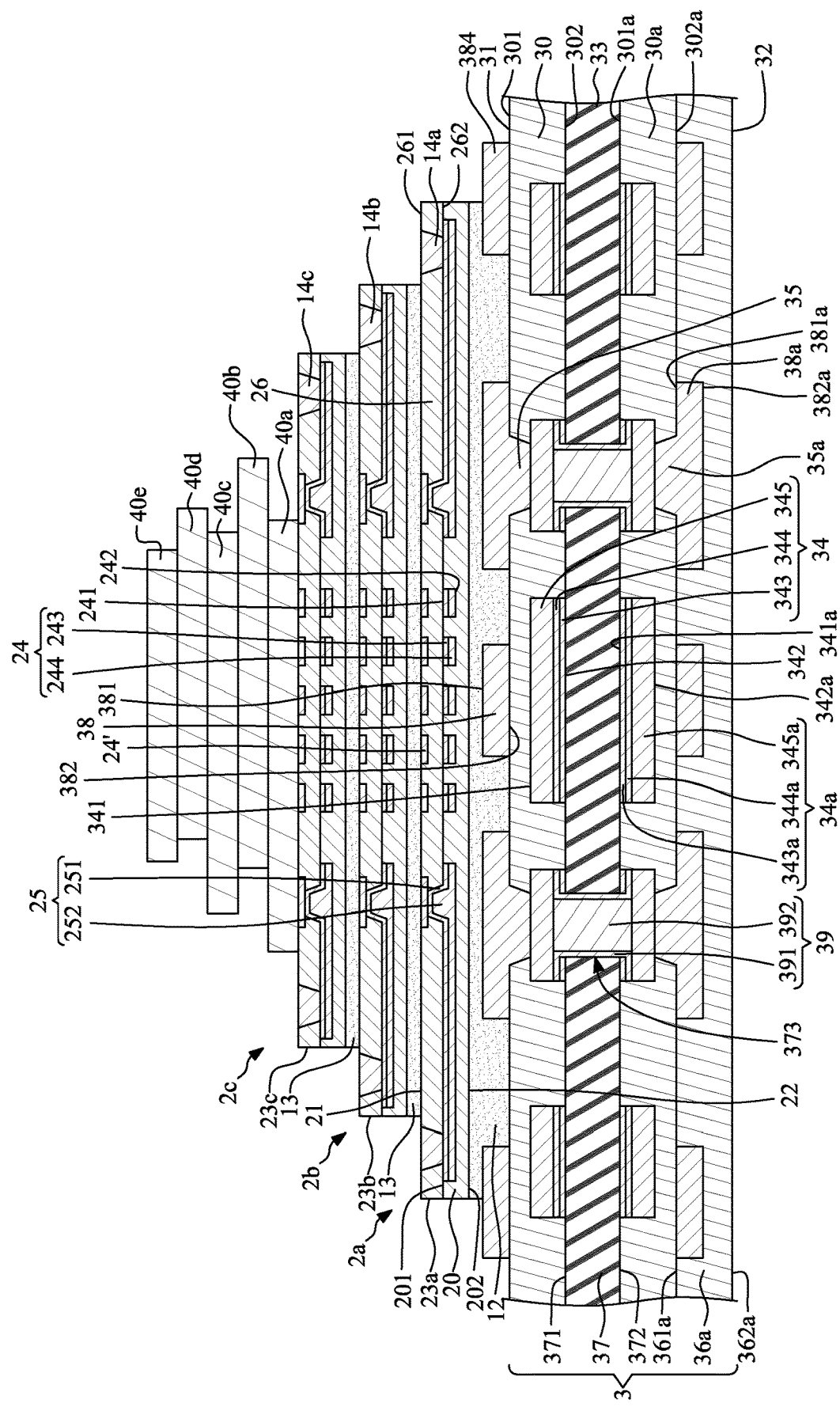
FIG. 37 illustrates one or more stages of an example of a method for manufacturing a wiring structure according to some embodiments of the present disclosure.

FIG. 37 illustrates a method for manufacturing a wiring structure according to some embodiments of the present disclosure. In some embodiments, the method is for manufacturing the wiring structure 1d shown in FIG. 6 and FIG. 7. The initial stages of the illustrated process are the same as, or similar to, the stages illustrated in FIG. 12 to FIG. 23 and FIG. 36. FIG. 37 depicts a stage subsequent to that depicted in FIG. 36.

Referring to FIG. 37, a plurality of electronic devices (e.g., a first memory die 40a, a second memory die 40b, a third memory die 40c, a fourth memory die 40d and a fifth memory die 40e) are stacked on one another, and are stacked on and adhered to the third upper conductive structure 2c.

The positions of the electronic devices (e.g., the first memory die 40a, the second memory die 40b, the third memory die 40c, the fourth memory die 40d and the fifth memory die 40e) may be shifted or laterally displaced from each other so as to facilitate a wire bonding process. For example, the second memory die 40b is shifted from the first memory die 40a to expose the bonding portions of the first memory die 40a. The sizes of the electronic devices (e.g., the first memory die 40a, the second memory die 40b, the third memory die 40c, the fourth memory die 40d and the fifth memory die 40e) may be same as or different from each other.

Then, a plurality of first bonding wires 15a are formed to connect the bonding portion 14a of the first upper conductive structure 2a and the bonding portion (e.g., the pad portion 384) of the second upper circuit layer 38 of the lower conductive structure 3. A plurality of second bonding wires 15b are formed to connect the bonding portions of two adjacent upper conductive structures. For example, some of the second bonding wires 15b connect the bonding portion 14b of the second upper conductive structure 2b and the bonding portion 14a of the first upper conductive structure 2a. Some of the second bonding wires 15b connect the bonding portion 14c of the third upper conductive structure 2c and the bonding portion 14b of the second upper conductive structure 2b. In addition, a plurality of third bonding wires 15c are formed to connect the bonding portions of the electronic devices (e.g., the first memory die 40a, the second memory die 40b, the third memory die 40c, the fourth memory die 40d and the fifth memory die 40e) and the bonding portions 14a, 14b, 14c of the upper conductive structures (e.g., the first upper conductive structure 2a, the second upper conductive structure 2b and the third upper conductive structure 2c).

In some embodiments, the first memory die 40a and the second memory die 40b may be electrically connected to the bonding portions 14c of the third upper conductive structure 2c through the third bonding wires 15c. The third memory die 40c and the fourth memory die 40d may be electrically connected to the bonding portions 14b of the second upper conductive structure 2b through the third bonding wires 15c. The fifth memory die 40e may be electrically connected to the bonding portions 14a of the first upper conductive structure 2a through the third bonding wires 15c. Then, the lower conductive structure 3 is singulated to from a wiring structure 1d as shown in FIG. 6 and FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to 10% of that numerical value, such as less than or equal to 5%, less than or equal to 4%, less than or equal to 3%, less than or equal to 2%, less than or equal to 1%, less than or equal to 0.5%, less than or equal to 0.1%, or less than or equal to 0.05%. For example, a first numerical value can be deemed to be "substantially" the same or equal to a second numerical value if the first numerical value is within a range of variation of less than or equal to 10% of the second numerical value, such as less than or equal to 5%, less than or equal to 44%, less than or equal to ±3%, less than or equal to 2%, less than or equal to ±1%, less than or equal to 0.5%, less than or equal to 0.1%, or less than or equal to 0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
a plurality of upper conductive structures each including a plurality of upper dielectric layers, a plurality of upper circuit layers in contact with the upper dielectric layers at least one bonding portion electrically connected to one of the upper circuit layers, and at least one inner via disposed between two adjacent ones of the upper circuit layers for electrically connecting the two adjacent ones of the upper circuit layers, wherein a tapering direction of the inner via is different from a tapering direction of the bonding portion;
a lower conductive structure including at least one lower dielectric layer and at least one lower circuit layer in contact with the lower dielectric layer; and
an intermediate layer disposed between the upper conductive structures and the lower conductive structure and bonding the upper conductive structures and the lower conductive structure together, wherein the upper conductive structures are electrically connected to the lower conductive structure,
wherein the plurality of upper conductive structures are stacked on one another, the wiring structure further comprises at least one intervening layer disposed between two adjacent ones of the upper conductive structures and bonds the two adjacent ones of the upper conductive structures together.

2. The wiring structure of claim 1, wherein the inner via tapers upwardly, and the bonding portion tapers downwardly.

3. The wiring structure of claim 1, wherein a line space of the lower circuit layer of the lower conductive structure is greater than a line space of the upper circuit layers of the plurality of upper conductive structures.

4. The wiring structure of claim 1, further comprising at least one bonding wire connecting the at least one bonding portion of one of the plurality of upper conductive structures and the lower conductive structure.

5. The wiring structure of claim 1, further comprising a plurality of bonding wires connecting bonding portions of two adjacent ones of the plurality of upper conductive structures.

6. The wiring structure of claim 1, further comprising a plurality of electronic devices and a plurality of bonding wires, wherein the electronic devices are stacked on the plurality of upper conductive structures, and the bonding wires connect the electronic devices and the bonding portions of the plurality of upper conductive structures.

7. The wiring structure of claim 6, wherein the positions of the electronic devices are shifted or laterally displaced from each other.

8. The wiring structure of claim 1, further comprising a plurality of through vias extending through the plurality of upper conductive structures, the intermediate layer and at least a portion of the lower conductive structure, and electrically connecting the plurality of upper conductive structures and the lower conductive structure.

9. The wiring structure of claim 1, wherein the lower conductive structure further includes a core portion, the at least one lower dielectric layer and the at least one lower circuit layer, wherein the at least one lower dielectric layer and the at least one lower circuit layer of the lower conductive structure are disposed adjacent to a surface of the core portion.

10. A wiring structure, comprising:
a low-density stacked structure including at least one dielectric layer, at least one low-density circuit layer in contact with the at least one dielectric layer, and at least one bonding portion electrically connected to the low-density circuit layer;
at least one high-density stacked structure disposed on the low-density stacked structure, wherein the high-density stacked structure includes at least one dielectric layer, at least one high-density circuit layer in contact with the at least one dielectric layer of the high-density stacked structure, and at least one bonding portion electrically connected to the high-density circuit layer;
an intermediate layer disposed between the low-density stacked structure and the high-density stacked structure and bonding the low-density stacked structure and the high-density stacked structure together; and
a plurality of bonding wires connecting the at least one bonding portion of the at least one high-density stacked structure and the at least one bonding portion of the low-density stacked structure.

11. The wiring structure of claim 10, wherein the high-density stacked structure includes a plurality of dielectric layers, a plurality of high-density circuit layers, the at least one bonding portion and at least one inner via disposed between two adjacent ones of the high-density circuit layers for electrically connecting the two adjacent ones of the high-density circuit layers, a tapering direction of the inner via is different from a tapering direction of the bonding portion.

12. The wiring structure of claim 10, wherein the at least one high-density stacked structure includes a plurality of dielectric layers including the dielectric layer, a plurality of high-density circuit layers including the high-density circuit layer, the at least one bonding portion and at least one inner via disposed between two adjacent ones of the high-density circuit layers for electrically connecting the two adjacent ones of the high-density circuit layers, the inner via tapers upwardly, and the bonding portion of the high-density stacked structure tapers downwardly.

13. The wiring structure of claim 10, wherein the at least one high-density stacked structure includes a plurality of dielectric layers including the dielectric layer, a plurality of high-density circuit layers including the high-density circuit layer, the at least one bonding portion and at least one inner via disposed between two adjacent ones of the high-density circuit layers for electrically connecting the two adjacent ones of the high-density circuit layers, a tapering direction of the inner via is different from a tapering direction of the bonding portion of the high-density stacked structure.

14. The wiring structure of claim 10, further comprising a plurality of electronic devices and a plurality of bonding wires, wherein the electronic devices are stacked on the at least one high-density stacked structure, and the bonding wires connect the electronic devices and the at least one bonding portion of the at least one high-density stacked structure.

15. The wiring structure of claim 14, wherein the positions of the electronic devices are shifted or laterally displaced from each other.

16. A wiring structure, comprising:
a low-density stacked structure including at least one dielectric layer and at least one low-density circuit layer in contact with the at least one dielectric layer;
at least one high-density stacked structure disposed on the low-density stacked structure, wherein the high-density stacked structure includes at least one dielectric layer, at least one high-density circuit layer in contact with the at least one dielectric layer of the high-density stacked structure, and at least one bonding portion electrically connected to the high-density circuit layer;

an intermediate layer disposed between the low-density stacked structure and the high-density stacked structure and bonding the low-density stacked structure and the high-density stacked structure together; and a plurality of thermal vias extending through the at least one high-density stacked structure and under a plurality of electronic devices for heat dissipation of the electronic devices.

17. The wiring structure of claim 16, wherein a line space of the low-density circuit layer of the low-density stacked structure is greater than a line space of the high-density circuit layer of the at least one high-density stacked structure.

18. The wiring structure of claim 16, further comprising a plurality of bonding wires, wherein the electronic devices are stacked on the at least one high-density stacked structure, and the bonding wires connect the electronic devices and the at least one bonding portion of the at least one high-density stacked structure.

19. The wiring structure of claim 16, wherein the at least one high-density stacked structure includes a plurality of dielectric layers including the dielectric layer, a plurality of high-density circuit layers including the high-density circuit layer, the at least one bonding portion and at least one inner via disposed between two adjacent ones of the high-density circuit layers for electrically connecting the two adjacent ones of the high-density circuit layers, the inner via tapers upwardly, and the bonding portion of the high-density stacked structure tapers downwardly.

20. The wiring structure of claim 16, wherein the at least one high-density stacked structure includes a plurality of dielectric layers including the dielectric layer, a plurality of high-density circuit layers including the high-density circuit layer, the at least one bonding portion and at least one inner via disposed between two adjacent ones of the high-density circuit layers for electrically connecting the two adjacent ones of the high-density circuit layers, a tapering direction of the inner via is different from a tapering direction of the bonding portion of the high-density stacked structure.

* * * * *